(12) United States Patent
Ouchi

(10) Patent No.: US 11,671,199 B2
(45) Date of Patent: *Jun. 6, 2023

(54) TRANSMISSION DEVICE, TRANSMISSION METHOD, RECEPTION DEVICE, AND RECEPTION METHOD

(71) Applicant: Panasonic Corporation, Osaka (JP)

(72) Inventor: Mikihiro Ouchi, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/556,256

(22) Filed: Dec. 20, 2021

(65) Prior Publication Data

US 2022/0116137 A1 Apr. 14, 2022

Related U.S. Application Data

(63) Continuation of application No. 16/932,968, filed on Jul. 20, 2020, now Pat. No. 11,239,943, which is a
(Continued)

(30) Foreign Application Priority Data

Jan. 31, 2014 (JP) .............................. JP2014-016785

(51) Int. Cl.
*H04L 1/00* (2006.01)
*H04L 27/34* (2006.01)
(Continued)

(52) U.S. Cl.
CPC ........ *H04L 1/0041* (2013.01); *H03M 13/255* (2013.01); *H04L 1/0045* (2013.01);
(Continued)

(58) Field of Classification Search
CPC ............... H04L 1/0041; H04L 27/3411; H04L 27/2602; H04L 27/2627; H04L 1/0045;
(Continued)

(56) References Cited

U.S. PATENT DOCUMENTS 5,831,690 A 11/1998 Lyons
6,081,650 A 6/2000 Lyons
(Continued)

FOREIGN PATENT DOCUMENTS

CN 1335001 2/2002
EP 2 214 367 8/2010
(Continued)

OTHER PUBLICATIONS

International Search Report of PCT application No. PCT/JP2015/000317 dated Apr. 14, 2015.
(Continued)

*Primary Examiner* — Cynthia Britt
(74) *Attorney, Agent, or Firm* — Wenderoth, Lind & Ponack, L.L.P.

(57) ABSTRACT

An FEC coder in a transmission device according to an exemplary embodiment of the present disclosure performs BCH coding and LDPC coding based on whether a code length of the LDPC coding is a 16k mode or a 64k mode. A mapper performs mapping in an I-Q coordinate to perform conversion into an FEC block, and outputs pieces of mapping data (cells). The mapper defines different non-uniform mapping patterns with respect to different code lengths even an identical coding rate is used by the FEC coder. This configuration improves a shaping gain for different error correction code lengths in a transmission technology in which modulation of the non-uniform mapping pattern is used.

2 Claims, 25 Drawing Sheets

Related U.S. Application Data continuation of application No. 16/353,296, filed on Mar. 14, 2019, now Pat. No. 10,756,845, which is a continuation of application No. 15/206,270, filed on Jul. 10, 2016, now Pat. No. 10,284,333, which is a continuation of application No. PCT/JP2015/000317, filed on Jan. 26, 2015.

(51) Int. Cl.

| | | |
|---|---|---|
| *H03M 13/25* | (2006.01) | |
| *H04L 27/26* | (2006.01) | |
| *H04L 27/36* | (2006.01) | |
| *H03M 13/29* | (2006.01) | |
| *H03M 13/11* | (2006.01) | |
| *H03M 13/15* | (2006.01) | |
| *H03M 13/00* | (2006.01) | |

(52) U.S. Cl.
CPC ........ *H04L 1/0057* (2013.01); *H04L 27/2602* (2013.01); *H04L 27/2627* (2013.01); *H04L 27/3411* (2013.01); *H04L 27/3488* (2013.01); *H03M 13/1102* (2013.01); *H03M 13/152* (2013.01); *H03M 13/2906* (2013.01); *H03M 13/6552* (2013.01); *H04L 27/2649* (2013.01); *H04L 27/362* (2013.01)

(58) Field of Classification Search
CPC . H04L 27/3488; H04L 1/0057; H04L 27/362; H04L 27/2649; H03M 13/255; H03M 13/2906; H03M 13/152; H03M 13/1102; H03M 13/6552
See application file for complete search history.

(56) References Cited

U.S. PATENT DOCUMENTS

| | | | | |
|---|---|---|---|---|
| 9,729,373 | B2 * | 8/2017 | Hwang | ............ H04L 5/0053 |
| 10,756,845 | B2 * | 8/2020 | Ouchi | ............ H04L 27/2602 |
| 11,239,943 | B2 * | 2/2022 | Ouchi | ............ H04L 27/3488 |
| 2009/0097582 | A1 | 4/2009 | Barsoum et al. | |
| 2012/0327955 | A1 | 12/2012 | Herrmann | |
| 2013/0083862 | A1 | 4/2013 | Barsoum et al. | |

FOREIGN PATENT DOCUMENTS

| | | |
|---|---|---|
| JP | 2010-538502 | 12/2010 |
| WO | 00/35136 | 6/2000 |
| WO | 2009/104931 | 8/2009 |
| WO | 2014/009191 | 1/2014 |

OTHER PUBLICATIONS

Extended European Search Report dated Dec. 16, 2016 in corresponding European Application No. 15743665.0.
J. Zoellner et al., "Optimization of High-order Non-uniform QAM Constellations" IEEE International Symposium on Broadband Multimedia Systems and Broadcasting. 2013.
Minhan Zheng et al., "Shaping Gain of LDPC Coded-QAM Transmitting Systems with Non-Uniform Constellation", ICCCAS 2007, International conference on 2007, pp. 6-9.
Physical Layer Signaling for the Next Generation Mobile TV Standard DVB-NGH, 2013, pp. 1, 2, 7-14, 22-27.
ETSI EN 302 755 V1.3.1, "Frame structure channel coding and modulation for a second generation digital terrestrial television broadcasting system (DVB-T2)", Apr. 2012.
ETSI TS 102 831 V1.2.1, "Implementation guidelines for a second generation digital terrestrial television broadcasting system (DVB-T2)" Aug. 2012.
ETSI EN 303 105 V1.1.1, "Next Generation Broadcasting system to Handheld, physical layer specification (DVB-NGH)" DVB Document A160, Nov. 2012.
D. Gomez-Barquero, D. Gozalvez, P.F. Gomez and N. Cardona, "Fading Margin Reduction Due to Interburst Upper Layer FEC in Terrestrial Mobile Broadcast Systems," in IEEE Transactions on Vehicular Technology, vol. 60, No. 7, pp. 3110-3117, Sep. 2011, (Year: 2011).
D. Gozalvez, D. Gomez-Barquero and T. Stockhammer, "Mobile reception of DVB-T services by means of AL-FEC protection," 2009 IEEE International Symposium on Broadband Multimedia Systems and Broadcasting, Bilbao, 2009, pp. 1-5. (Year: 2009).
Office Action dated Apr. 27, 2021 in Chinese Application No. 201910103172.4 with English translation of Search Report.
Cong Shen and M. P. Fitz, "A utility maximization approach to the design of unequal error protection with multilevel codes," 2008, IEEE International Symposium on Information Theory, Toronto, ON, Canada, 2008, pp. 2031-2035. (Year: 2008).

* cited by examiner

FIG. 4

| y0q y2q y4q | | | | | | | | | |
|---|---|---|---|---|---|---|---|---|---|
| 1 | 1 | 1 | 1 | - | 0 | 0 | 0 | | |
| 0 | 0 | 1 | 1 | - | 1 | 1 | 0 | | |
| 0 | 1 | 1 | 0 | - | 0 | 1 | 0 | | |
| -7.0 | -5.4 | -1.8 | -1.4 | 1.4 | 1.8 | 5.4 | 7.0 | I | CODING RATIO OF 1/3 |
| -7.2 | -5.2 | -1.9 | -1.4 | 1.4 | 1.9 | 5.2 | 7.2 | | CODING RATIO OF 2/5 |
| -7.4 | -4.9 | -2.0 | -1.3 | 1.3 | 2.0 | 4.9 | 7.4 | | CODING RATIO OF 7/15 |
| -7.5 | -4.6 | -2.3 | -1.0 | 1.0 | 2.3 | 4.6 | 7.5 | | CODING RATIO OF 8/15 |
| -7.5 | -4.6 | -2.4 | -0.9 | 0.9 | 2.4 | 4.6 | 7.5 | | CODING RATIO OF 3/5 |
| -7.5 | -4.6 | -2.5 | -0.9 | 0.9 | 2.5 | 4.6 | 7.5 | | CODING RATIO OF 2/3 |
| -7.4 | -4.7 | -2.6 | -0.9 | 0.9 | 2.6 | 4.7 | 7.4 | | CODING RATIO OF 11/15 |

| y1q y3q y5q | | | | | | | | | |
|---|---|---|---|---|---|---|---|---|---|
| 1 | 1 | 1 | 1 | - | 0 | 0 | 0 | | |
| 0 | 0 | 1 | 1 | - | 1 | 1 | 0 | | |
| 0 | 1 | 1 | 0 | - | 0 | 1 | 0 | | |
| -7.0 | -5.4 | -1.8 | -1.4 | 1.4 | 1.8 | 5.4 | 7.0 | Q | CODING RATIO OF 1/3 |
| -7.2 | -5.2 | -1.9 | -1.4 | 1.4 | 1.9 | 5.2 | 7.2 | | CODING RATIO OF 2/5 |
| -7.4 | -4.9 | -2.0 | -1.3 | 1.3 | 2.0 | 4.9 | 7.4 | | CODING RATIO OF 7/15 |
| -7.5 | -4.6 | -2.3 | -1.0 | 1.0 | 2.3 | 4.6 | 7.5 | | CODING RATIO OF 8/15 |
| -7.5 | -4.6 | -2.4 | -0.9 | 0.9 | 2.4 | 4.6 | 7.5 | | CODING RATIO OF 3/5 |
| -7.5 | -4.6 | -2.5 | -0.9 | 0.9 | 2.5 | 4.6 | 7.5 | | CODING RATIO OF 2/3 |
| -7.4 | -4.7 | -2.6 | -0.9 | 0.9 | 2.6 | 4.7 | 7.4 | | CODING RATIO OF 11/15 |

```
for i=0...NUM_PLP-1
{
   ......
   PLP_FEC_TYPE  //"00": 16k LDPC, "01": 64k LDPC
   PLP_COD  //"0000": 3/15, "0001": 4/15, ......, "0111": 10/15, "1000": 11/15
   ......
   PLP_NON_UNIFORM_CONST  //"0": UNIFORM MAPPING, "1": NON-UNIFORM MAPPING
   ......
   PLP_MOD  //"000": QPSK, "001": 16QAM, "010": 64QAM, "011": 256QAM,
   ......
}
```

```
......
L1_POST_FEC_TYPE  //"00": 4k LDPC
L1_POST_COD  //"00": 7/15
......
L1_POST_NON_UNIFORM_CONST  //"0": UNIFORM MAPPING, "1": NON-UNIFORM MAPPING
......
L1_POST_MOD  //"0000": BPSK, "0001": QPSK, "0010": 16QAM, "0011": 64QAM
......
```

......
L1_POST_FEC_TYPE //"00": 16k LDPC
L1_POST_COD //"00": 7/15

......
L1_POST_NON_UNIFORM_CONST //"0": UNIFORM MAPPING, "1": NON-UNIFORM MAPPING

L1_POST_MOD //"0000": BPSK, "0001": QPSK, "0010": 16QAM, "0011": 64QAM

| y0q y2q y4q | | | | | | | | | I | CODING RATIO OF 1/3 | CODING RATIO OF 2/5 | CODING RATIO OF 7/15 | CODING RATIO OF 8/15 | CODING RATIO OF 3/5 | CODING RATIO OF 2/3 | CODING RATIO OF 11/15 |
|---|---|---|---|---|---|---|---|---|---|---|---|---|---|---|---|---|
| | 1 | 1 | 1 | 1 | 0 | 0 | 0 | 0 | | -7.4 | -7.5 | -7.5 | -7.5 | -7.4 | -7.3 | -7.2 |
| | 0 | 0 | 1 | 1 | 1 | 1 | 0 | 0 | | -4.9 | -4.6 | -4.6 | -4.6 | -4.7 | -4.7 | -4.8 |
| | 0 | 1 | 1 | 1 | 1 | 1 | 0 | 1 | | -2.0 | -2.3 | -2.4 | -2.5 | -2.6 | -2.7 | -2.8 |
| | | | | | | | | | | -1.3 | -1.0 | -0.9 | -0.9 | -0.9 | -0.9 | -0.9 |
| | | | | | | | | | | 1.3 | 1.0 | 0.9 | 0.9 | 0.9 | 0.9 | 0.9 |
| | | | | | | | | | | 2.0 | 2.3 | 2.4 | 2.5 | 2.6 | 2.7 | 2.8 |
| | | | | | | | | | | 4.9 | 4.6 | 4.6 | 4.6 | 4.7 | 4.7 | 4.8 |
| | | | | | | | | | | 7.4 | 7.5 | 7.5 | 7.5 | 7.4 | 7.3 | 7.2 |

| y1q y3q y5q | | | | | | | | | Q | CODING RATIO OF 1/3 | CODING RATIO OF 2/5 | CODING RATIO OF 7/15 | CODING RATIO OF 8/15 | CODING RATIO OF 3/5 | CODING RATIO OF 2/3 | CODING RATIO OF 11/15 |
|---|---|---|---|---|---|---|---|---|---|---|---|---|---|---|---|---|
| | 1 | 1 | 1 | 1 | 0 | 0 | 0 | 0 | | -7.4 | -7.5 | -7.5 | -7.5 | -7.4 | -7.3 | -7.2 |
| | 0 | 0 | 1 | 1 | 1 | 1 | 0 | 0 | | -4.9 | -4.6 | -4.6 | -4.6 | -4.7 | -4.7 | -4.8 |
| | 0 | 1 | 0 | 1 | 1 | 1 | 0 | 1 | | -2.0 | -2.3 | -2.4 | -2.5 | -2.6 | -2.7 | -2.8 |
| | | | | | | | | | | -1.3 | -1.0 | -0.9 | -0.9 | -0.9 | -0.9 | -0.9 |
| | | | | | | | | | | 1.3 | 1.0 | 0.9 | 0.9 | 0.9 | 0.9 | 0.9 |
| | | | | | | | | | | 2.0 | 2.3 | 2.4 | 2.5 | 2.6 | 2.7 | 2.8 |
| | | | | | | | | | | 4.9 | 4.6 | 4.6 | 4.6 | 4.7 | 4.7 | 4.8 |
| | | | | | | | | | | 7.4 | 7.5 | 7.5 | 7.5 | 7.4 | 7.3 | 7.2 |

```
for i=0...NUM_PLP-1
{
   ......
   PLP_FEC_TYPE  //"00": 16k LDPC
   PLP_COD  //"0000": 3/15, "0001": 4/15, ......, "0111": 10/15, "1000": 11/15
   ......
   PLP_NON_UNIFORM_CONST  //"0": UNIFORM MAPPING, "1": NON-UNIFORM MAPPING
   ......
   PLP_MOD  //"000": QPSK, "001": 16QAM, "010": 64QAM, "011": 256QAM,
   ......
}
```

FIG. 28

| y0q | 1 | 1 | 1 | 1 | 0 | 0 | 0 | 0 |
|-----|---|---|---|---|---|---|---|---|
| y2q | 0 | 0 | 1 | 1 | 1 | 1 | 0 | 0 |
| y4q | 0 | 1 | 1 | 0 | 0 | 1 | 1 | 0 |
| I   | -7 | -5 | -3 | -1 | 1 | 3 | 5 | 7 |

| y1q | 1 | 1 | 1 | 1 | 0 | 0 | 0 | 0 |
|-----|---|---|---|---|---|---|---|---|
| y3q | 0 | 0 | 1 | 1 | 1 | 1 | 0 | 0 |
| y5q | 0 | 1 | 1 | 0 | 0 | 1 | 1 | 0 |
| Q   | -7 | -5 | -3 | -1 | 1 | 3 | 5 | 7 |

BIT SEQUENCE y0qy1qy2qy3qy4qy5q (64-QAM constellation diagram with I/Q axes from -9 to 9, showing points labeled with 6-bit sequences)

Row Q=7: 100000, 100010, 001010, 001000, 000010, 000000, 000001, 000011, 001011, 001001, 010011, 010001, 010000

Row Q=5: 100001, 100011, 001011, 001001, 000011, 000001, 000011, 010011, 010001

Row Q=3: 100101, 100111, 001111, 001101, 000111, 000101, 000111, 010111, 010101

Row Q=1: 100100, 100110, 001110, 001100, 000110, 000100, 000110, 010110, 010100

Row Q=-1: 110100, 110110, 011110, 011100, 111110, 111100, 111110, 011110, 011100

Row Q=-3: 110101, 110111, 011111, 011101, 111111, 111101, 111111, 011111, 011101

Row Q=-5: 110001, 110011, 011011, 011001, 111011, 111001, 111011, 011011, 011001

Row Q=-7: 110000, 110010, 011010, 011000, 111010, 111000, 111010, 011010, 011000

FIG. 30

| y0q y2q y4q | 1 0 0 | 1 0 1 | 1 1 1 | 1 1 0 | 0 1 0 | 0 1 1 | 0 0 1 | 0 0 0 | I |
|---|---|---|---|---|---|---|---|---|---|
| | −7.2 | −5.2 | −1.9 | −1.4 | 1.4 | 1.9 | 5.2 | 7.2 | CODING RATIO OF 1/3 |
| | −7.4 | −4.9 | −2.0 | −1.3 | 1.3 | 2.0 | 4.9 | 7.4 | CODING RATIO OF 2/5 |
| | −7.5 | −4.6 | −2.3 | −1.0 | 1.0 | 2.3 | 4.6 | 7.5 | CODING RATIO OF 7/15 |
| | −7.5 | −4.6 | −2.4 | −0.9 | 0.9 | 2.4 | 4.6 | 7.5 | CODING RATIO OF 8/15 |
| | −7.5 | −4.6 | −2.5 | −0.9 | 0.9 | 2.5 | 4.6 | 7.5 | CODING RATIO OF 3/5 |
| | −7.4 | −4.7 | −2.6 | −0.9 | 0.9 | 2.6 | 4.7 | 7.4 | CODING RATIO OF 2/3 |
| | −7.3 | −4.7 | −2.7 | −0.9 | 0.9 | 2.7 | 4.7 | 7.3 | CODING RATIO OF 11/15 |

| y1q y3q y5q | 1 0 0 | 1 0 1 | 1 1 1 | 1 1 0 | 0 1 0 | 0 1 1 | 0 0 1 | 0 0 0 | Q |
|---|---|---|---|---|---|---|---|---|---|
| | −7.2 | −5.2 | −1.9 | −1.4 | 1.4 | 1.9 | 5.2 | 7.2 | CODING RATIO OF 1/3 |
| | −7.4 | −4.9 | −2.0 | −1.3 | 1.3 | 2.0 | 4.9 | 7.4 | CODING RATIO OF 2/5 |
| | −7.5 | −4.6 | −2.3 | −1.0 | 1.0 | 2.3 | 4.6 | 7.5 | CODING RATIO OF 7/15 |
| | −7.5 | −4.6 | −2.4 | −0.9 | 0.9 | 2.4 | 4.6 | 7.5 | CODING RATIO OF 8/15 |
| | −7.5 | −4.6 | −2.5 | −0.9 | 0.9 | 2.5 | 4.6 | 7.5 | CODING RATIO OF 3/5 |
| | −7.4 | −4.7 | −2.6 | −0.9 | 0.9 | 2.6 | 4.7 | 7.4 | CODING RATIO OF 2/3 |
| | −7.3 | −4.7 | −2.7 | −0.9 | 0.9 | 2.7 | 4.7 | 7.3 | CODING RATIO OF 11/15 |

TRANSMISSION DEVICE, TRANSMISSION METHOD, RECEPTION DEVICE, AND RECEPTION METHOD

BACKGROUND

1. Technical Field

The present disclosure relates to a transmission technology in which modulation having a non-uniform mapping pattern is used.

2. Description of the Related Art

In European countries and other countries except for Europe, digitalization of television broadcasting is widely proceeding by using a DVB-T (DVB-Terrestrial) system that is a transmission standard of digital terrestrial television broadcasting in Europe. On the other hand, standardization of a DVB-T2 system that is a standard of second generation digital terrestrial television broadcasting was started in 2006 to improve frequency use efficiency, and HDTV service was started as regular broadcasting in 2009 in Britain. In the DVB-T2 system, an OFDM (Orthogonal Frequency Division Multiplexing) system is adopted similarly to the DVB-T system (NPLs 1 and 2).

On the other hand, standardization of a DVB-NGH (DVB-Next Generation Handheld) system that is a transmission standard for a portable and mobile receiver was started in 2010, and a specification draft was approved by a DVB-TM (DVB-Technical Module) in September, 2012 and published as a rulebook in November, 2012 (NPL 3).

CITATION LIST

Non-Patent Literatures

NPL 1: ETSI EN 302 755 V1.3.1 (April, 2012): Frame structure channel coding and modulation for a second generation digital terrestrial television broadcasting system (DVB-T2)

NPL 2: ETSI TS 102 831 V1.2.1 (August, 2012): Implementation guidelines for a second generation digital terrestrial television broadcasting system (DVB-T2)

NPL 3: DVB BlueBook A160 (November, 2012): Next Generation broadcasting system to Handheld, physical layer specification (DVB-NGH) (Draft ETSI EN 303 105 V1.1.1)

SUMMARY

In one general aspect, the techniques disclosed here feature a transmission device including: an error correction coder that performs error correction coding on each data block having a predetermined length to generate an error correction coded frame; and a mapper that maps the error correction coded frame to a symbol by a unit of a predetermined number of bits to generate an error correction coded block. And the mapper maps a first error correction coded frame having the first length and a second error correction coded frame having the second length in non-uniform patterns that are different from each other even if coding rates for the first error correction coded frame and the second error correction coded frame in the error correction coder are identical to each other.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

It should be noted that general or specific embodiments may be implemented as a system, a method, an integrated circuit, a computer program, a storage medium, or any selective combination thereof.

BRIEF DESCRIPTION OF THE DRAWINGS

FIG. 4 is a view illustrating the 64QAM (all coding rates) constellation arrangement of the non-uniform mapping pattern when the code length of LDPC coding is the 64 k mode in the first exemplary embodiment;

FIG. 20 is a view illustrating the 64QAM (all coding rates) constellation arrangement of the non-uniform mapping pattern in the MIMO profile in the third exemplary embodiment;

FIG. 28 is a view illustrating a 64QAM constellation arrangement of a uniform mapping pattern in the conventional DVB-NGH system;

FIG. 30 is a view illustrating the 64QAM (all coding rates) constellation arrangement of the non-uniform mapping pattern in the conventional DVB-NGH system.

DETAILED DESCRIPTION (Underlying Knowledge of the Present Disclosure)

Figure 24:
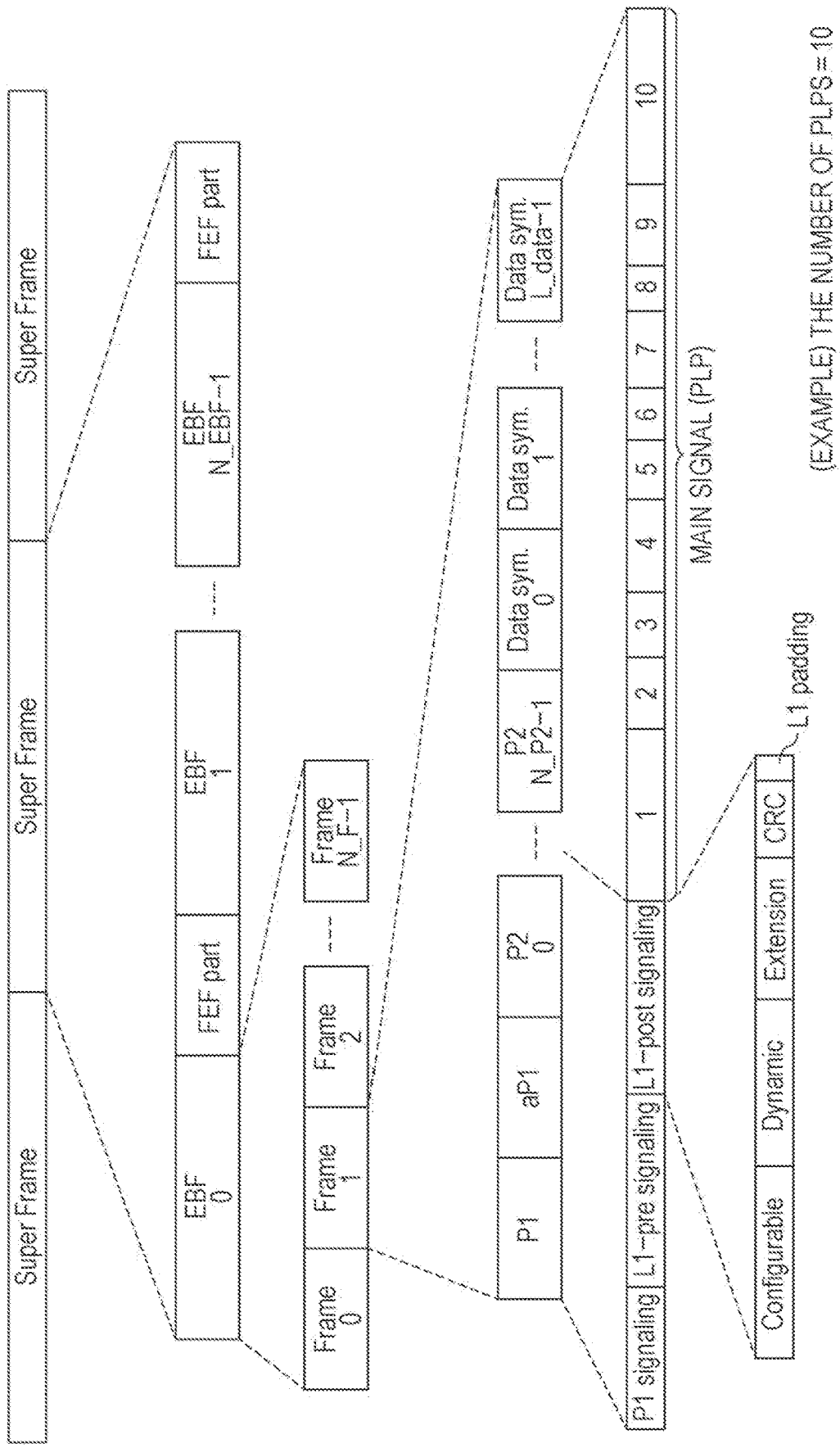
FIG. 24 is a view illustrating a transmission frame configuration of a DVB-NGH system.

FIG. 24 is a view illustrating a transmission frame configuration of a DVB-NGH system. The DVB-NGH system has a concept called a PLP (Physical Layer Pipe), and one of features of the DVB-NGH system is that transmission parameters such as a modulation method and a coding rate can independently be set in each PLP. The PLP has a minimum number of 1 and a maximum number of 255, and FIG. 24 illustrates the case that the number of PLPs is 10 by way of example.

The transmission frame configuration is described below.
super-frame=N_EBF frame group basic block (N_EBF=2 to 255)
frame group basic block=N_F frame (N_F=1 to 255)
frame=P1 symbol+aP1 symbol+P2 symbol+data symbol
P1 symbol=1 symbol
aP1 symbol=0 to 1 symbols
P2 symbol=N_P2 symbol (N_P2 is uniquely decided by an FFT size)
data symbol=L_data symbol (L_data is variable and has upper and lower limits)

The P1 symbol is transmitted with the FFT size of 1 k and GI (Guard Interval) of ½. In the P1 symbol, a format (such as NGH_SISO, NGH_MISO, and ESC indicating others) of a frame started from the P1 symbol is transmitted by 3 bits of S1.

In the P1 symbol, pieces of information about the subsequent P2 symbol, the FFT size in the data symbol, and the like are transmitted by 4 bits of S2 in the case that the format of the frame is NGH_SISO or NGH_MISO. In the P1 symbol, the format (such as NGH_MIMO) of the frame is transmitted by 4 bits of S2 in the case that the format of the frame is ESC indicating others.

The aP1 symbol is transmitted only when transmitted together with ESC by S1 in the P1 symbol. Although the aP1 symbol is transmitted with the FFT size of 1 k and GI (Guard Interval) of ½ similarly to the P1 symbol, the aP1 symbol differs from the P1 symbol in a GI generation method. In the aP1 symbol, pieces of information about the subsequent P2 symbol, the FFT size in the data symbol, and the like are transmitted by 3 bits of S3.

A first half of the P2 symbol includes L1 signaling information, and a remaining second half includes main signal data. The data symbol includes a continuation of the main signal data.

The L1 signaling information transmitted in the P2 symbol is configured by L1-pre information mainly transmitting information common to all the PLPs and L1-post information mainly transmitting information about each PLP. FIG. 24 illustrates a configuration of an LC (Logical Channel) type A in which the L1-post information is transmitted subsequently to the L1-pre information. In an LC type B, transmission sequence of the L1-post information is not limited to the next to the L1-pre information.

Figure 25:
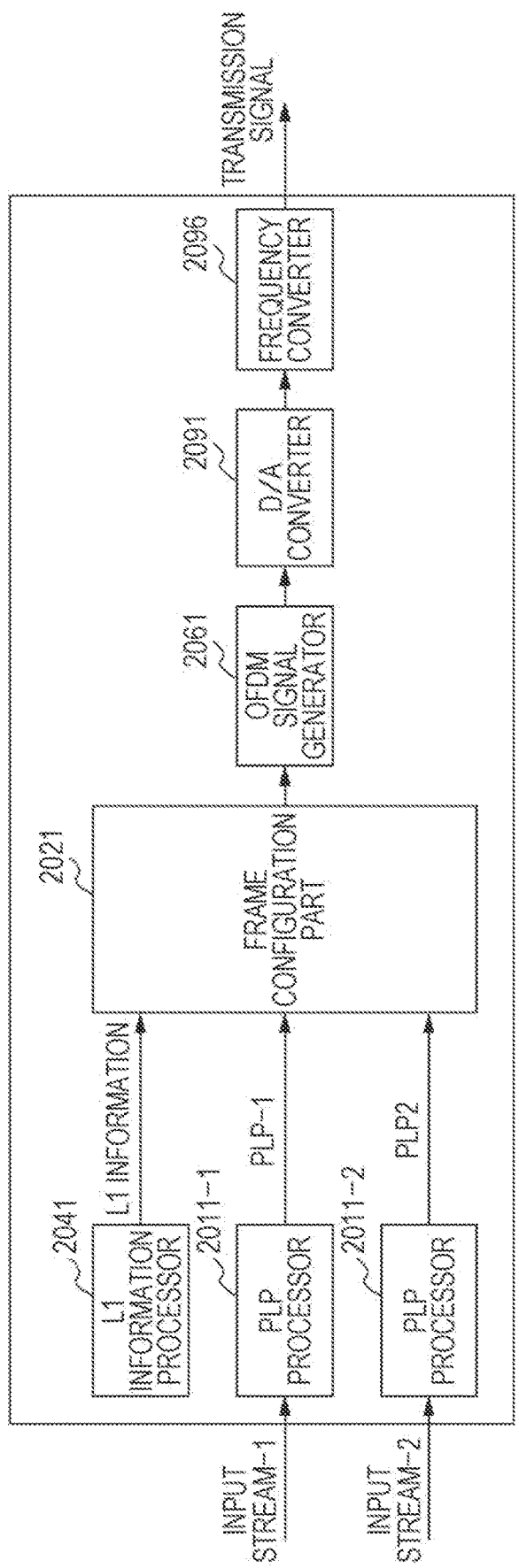
FIG. 25 is a view illustrating a configuration of transmission device 2000 in a base profile (SISO frame) of a conventional DVB-NGH system.

FIG. 25 is a view illustrating a configuration of transmission device 2000 in a base profile of the DVB-NGH system (see NPL 3). Particularly, FIG. 25 illustrates the case of an SISO (Single Input Single Output) frame. By way of example, transmission device 2000 illustrates the case that two streams are input, namely, two PLPs are generated, and includes PLP processor 2011 for each PLP. Transmission device 2000 includes L1 (Layer-1) information processor 2041, frame configuration part 2021, OFDM signal generator 2061, D/A converter 2091, and frequency converter 2096.

Operation of transmission device 2000 will be described below. PLP processor 2011 for each PLP adapts each input stream to the PLP, performs processing associated with PLP, and outputs mapping data (cell) of each PLP. Examples of the input stream include a TS (Transport Stream), a service component, such as audio and video, which is included in a program in which the TS exists, and service sub-component such as a base layer and an enhancement layer of a picture in which SVC (Scalable Video Coding) is used. Examples of the information source coding include H.264 and HEVC (H.265).

L1 information processor 2041 performs processing associated with the L1 information, and outputs the mapping data of the L1 information. Frame configuration part 2021 generates and outputs transmission frame of the DVB-NGH system in FIG. 24 using the mapping data of each PLP output from PLP processor 2011 and mapping data of the L1 information output from L1 information processor 2041.

OFDM signal generator 2061 performs addition of a pilot signal, an IFFT (Inverse Fast Fourier Transform), insertion of the GI, and insertion of the P1 symbol on the transmission frame configuration of the DVB-NGH system output from frame configuration part 2021, and outputs a digital baseband transmission signal of the DVB-NGH system. D/A converter 2091 performs D/A conversion on the digital baseband transmission signal of the DVB-NGH system output from OFDM signal generator 2061, and outputs an analog baseband transmission signal of the DVB-NGH system. Frequency converter 2096 performs frequency conversion on the analog baseband transmission signal of the DVB-NGH system output from D/A converter 2091, and outputs an analog RF transmission signal of the DVB-NGH system from a transmission antenna (not illustrated).

Figure 26:
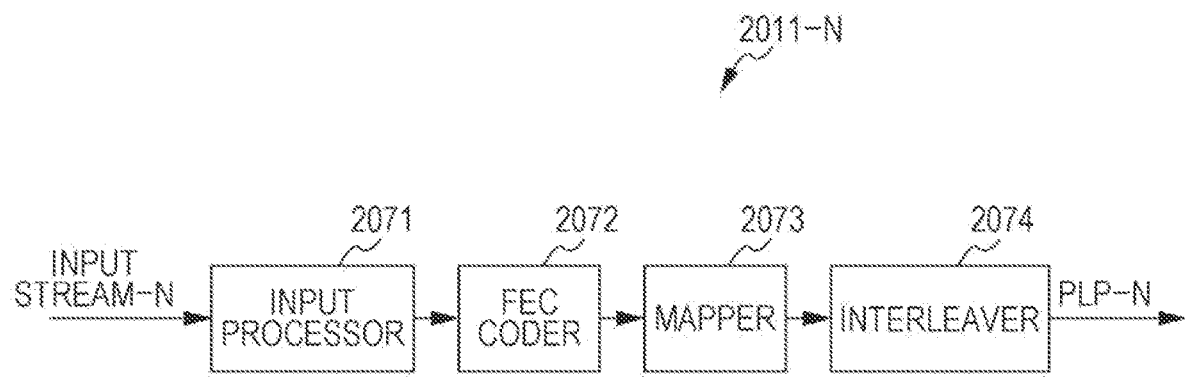
FIG. 26 is a view illustrating a configuration of PLP processor 2011 in the conventional DVB-NGH system.

The operation of PLP processor 2011 will be described in detail below. As illustrated in FIG. 26, PLP processor 2011 includes input processor 2071, FEC (Forward Error Correction) coder 2072, mapper 2073, and interleaver 2074.

In PLP processor 2011, input processor 2071 converts the input stream into a baseband frame. FEC coder 2072 adds a parity bit by performing the BCH coding and the LDPC coding in each baseband frame, thereby generating an FEC frame. Mapper 2073 performs the mapping in the I-Q coordinate to perform the conversion into the FEC block, and outputs pieces of mapping data (cell). Interleaver 2074 rearranges the pieces of mapping data (cell) in a TI (Time Interleaving) block including the integral number of FEC blocks.

Figure 27:
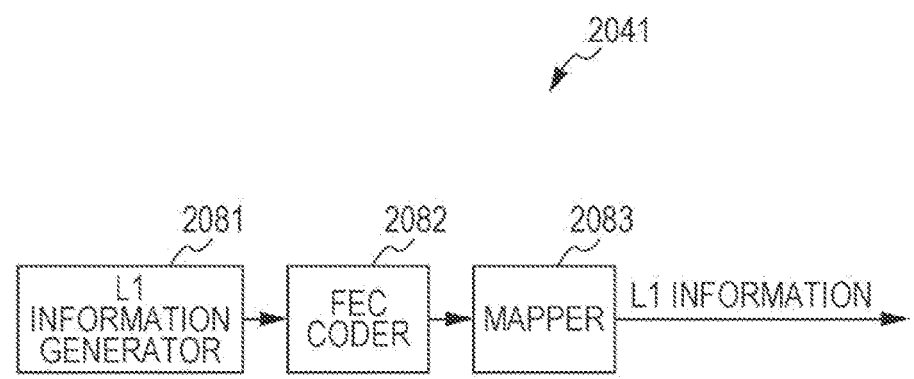
FIG. 27 is a view illustrating a configuration of L1 information processor 2041 in the conventional DVB-NGH system.

The operation of L1 information processor 2041 will be described in detail below. As illustrated in FIG. 27, L1 information processor 2041 includes L1 information generator 2081, FEC coder 2082, and mapper 2083.

In L1 information processor 2041, L1 information generator 2081 generates the transmission parameters to perform conversion into the L1-pre information and L1-post information. FEC coder 2082 adds the parity bit by performing the BCH coding and the LDPC coding in each of the L1-pre information and the L1-post information. Mapper 2083 performs mapping in the I-Q coordinate, and outputs the pieces of mapping data (cells).

As to the modulation method, the DVB-T2 system adopts only QAM (Quadrature Amplitude Modulation) of the uniform mapping pattern. On the other hand, the DVB-NGH system adopts not only the QAM of the-uniform mapping pattern but also the QAM of the non-uniform mapping pattern.

Figure 29:
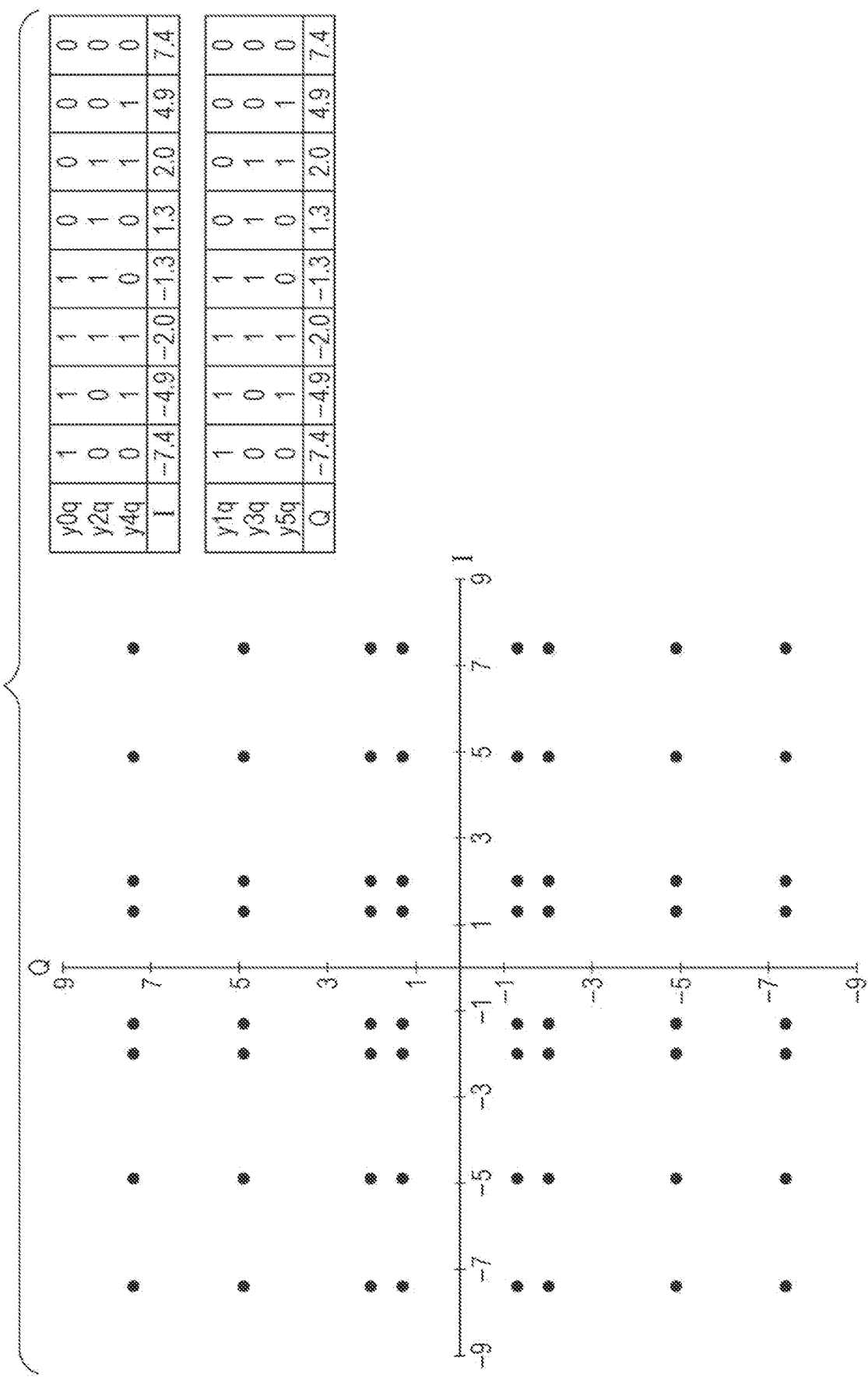
FIG. 29 is a view illustrating the 64QAM (coding rate of 2/5) constellation arrangement of the non-uniform mapping pattern in the conventional DVB-NGH system.

FIGS. 28 and 29 illustrate the 64QAM constellation arrangement of the uniform mapping pattern and the 64QAM (coding rate 2/5) constellation arrangement of the non-uniform mapping pattern in the DVB-NGH system, respectively. FIGS. 28(*a*) and 29(*a*) illustrate the constellation arrangement, and FIGS. 28(*b*) and 29(*b*) illustrate the I-Q coordinate.

In an information theory, it is well known that a shaping gain is obtained in the case that an amplitude of transmitter output follows a Gaussian distribution in an additive white Gaussian noise (AWGN) channel. In the non-uniform mapping of FIG. 29, the number of low-power mapping points is increased and the number of high-power mapping points is decreased, whereby the amplitude of the transmitter output follows the Gaussian distribution in the case that each mapping point is generated with the same probability. The Gaussian distribution varies according to magnitude of the AWGN, namely, a C/N (Carrier to Noise) ratio in a receiver.

Because the DVB-NGH system is a broadcasting standard, the non-uniform mapping pattern cannot be changed according to the C/N ratio in each receiver. Therefore, the non-uniform mapping pattern is defined according to a required C/N ratio of each coding rate, which maximizes the shaping gain near the required C/N ratio. FIG. 30 illustrates the 64QAM (all coding rates) constellation arrangement of the non-uniform mapping pattern in the DVB-NGH system.

(Problem)

As described above, in the DVB-NGH system, the non-uniform mapping pattern is defined in each coding rate. In the DVB-NGH system, only 16,200 bits (hereinafter, referred to as a 16 k mode) are adopted to the data PLP (Physical Layer Pipe) as a code length of the LDPC coding. On the other hand, in the DVB-T2 system, not only the 16 k mode but also 64,800 bits (hereinafter, referred to as a 64 k mode) are adopted. The 64 k mode having the long code length has an error correction capability higher than that of the 16 k mode having the short code length, and there is a possibility of hardly obtaining the maximum shaping gain near the required C/N ratio in the case that the non-uniform mapping pattern of the DVB-NGH system is directly adapted to the 64 k mode.

In the DVB-NGH system, only 4,320 bits (hereinafter, referred to as a 4 k mode) are adapted to the L1 signaling information. In the L1 signaling information, not only the uniform mapping but also the non-uniform mapping are adopted to the L1-post information. Because the non-uniform mapping pattern is identical to that of the data PLP in which the 16 k mode is used, there is a possibility of hardly obtaining the maximum shaping gain near the required C/N ratio.

In the DVB-T2 system, only the 16 k mode is adopted to the L1 signaling information, and only a coding rate of 4/9 is adopted to the L1-post information. The coding rate of 4/9 is one of coding rates adopted to the data PLP. In the L1-post information, shortening or puncture is performed for a small number of information bits, and the error correction capability degrades due to the small number of information bits. Therefore, there is a possibility of hardly obtaining the maximum shaping gain near the required C/N ratio in the case that the non-uniform mapping pattern of the data PLP is directly adapted to the L1-post information.

In the DVB-NGH system, only uniform mapping is adopted to an MIMO (Multiple Input Multiple Output) profile. The MIMO is a parallel transmission in which a plurality of transmission and reception antennas are used. In the MIMO, because an influence of interference between the antennas is not completely removed, the required C/N ratio increases in the case that the same modulation method, coding rate, and code length as the SISO are used. Therefore, there is a possibility of hardly obtaining the maximum shaping gain near the required C/N ratio in the case that the non-uniform mapping pattern of the SISO is directly adapted to the MIMO.

In order to solve the above problems, the present disclosure provides a transmission device, a transmission method, a reception device, and a reception method for efficiently obtaining the shaping gain using the modulation having the non-uniform mapping pattern.

(Solving Means)

A transmission device according to a first disclosure includes: an error correction coder that performs error correction coding on each data block having a predetermined length to generate an error correction coded frame; and a mapper that maps the error correction coded frame in a symbol in each predetermined number of bits to generate an error correction coded block. At this point, at least two kinds of the lengths of the error correction coded frame are selectable, and the mapper maps a first length and a second length of the error correction coded frame in non-uniform patterns different from each other even if coding rates in the error correction coder are identical to each other.

In the transmission device of the first disclosure, the transmission device according to a second disclosure further includes: an L1 signaling information processor that generates L1 (Layer-1) signaling information in which a transmission parameter is stored, performs the error correction coding on the L1 signaling information, and maps the L1 signaling information in the symbol in each predetermined number of bits; and a frame configuration part that configures a transmission frame including an error correction coded block output from the mapper and mapping data of L1 signaling information output from the L1 signaling information processor. At this point, the length and coding rate of the error correction coded frame are included as the L1 signaling information.

There is provided a reception device according to a third disclosure that receives a signal, which is transmitted while a first length and a second length of an error correction coded frame are mapped in non-uniform patterns different from each other even if a coding rate of error correction coding is identical, the reception device including: a demodulator that demodulates the transmission signal; and a de-mapper that decodes the length and coding rate of the error correction coded frame from data demodulated by the demodulator, and detects the mapping of the non-uniform pattern to perform de-mapping.

A transmission device according to a fourth disclosure includes: an error correction coder that performs error correction coding on each data block having a predetermined length to generate an error correction coded frame; a mapper that maps the error correction coded frame in a symbol in each predetermined number of bits to generate an error correction coded block; an L1 signaling information processor that generates L1 (Layer-1) signaling information in which a transmission parameter is stored, performs the error correction coding on the L1 signaling information to generate an L1 error correction coded frame, and maps the L1 error correction coded frame in the symbol in each predetermined number of bits; and a frame configuration part that configures a transmission frame including an error correction coded block output from the mapper and mapping data of L1 signaling information output from the L1 signaling information processor. At this point, the L1 signaling information processor performs the mapping different from the mapping of a non-uniform pattern in the mapper even if a coding rate in the error correction coding of the L1 signaling information is identical to a coding rate in the error correction coder.

In the transmission device according to a fifth disclosure, in the transmission device of the fourth disclosure, a length of the L1 error correction coded frame is different from a length of the error correction coded frame.

In the transmission device according to a sixth disclosure, in the transmission device of the fourth disclosure, the L1 signaling information processor performs at least one of shortening processing before the error correction coding of the L1 signaling information and puncture processing after the error correction coding of the L1 signaling information.

In the transmission device according to a seventh disclosure, in the transmission device of the sixth disclosure, a length of the L1 error correction coded frame is identical to a length of the error correction coded frame.

There is provided a reception device according to an eighth disclosure that receives a signal, which is transmitted while mapped in non-uniform patterns different from each other even if a coding rate of L1 (Layer-1) signaling information in which a transmission parameter is stored is identical to a coding rate of error correction coding of a transmission stream, the reception device including: a demodulator that demodulates the transmission signal; an extractor that extracts the L1 signaling information and the transmission stream from data demodulated by the demodulator; and a de-mapper that de-maps the extracted L1 signaling information and the extracted transmission stream based on non-uniform patterns different from each other.

There is provided a transmission device according to a ninth disclosure having a function of conducting communication by at least two transmission systems in SISO (Single Input Single Output), MISO (Multiple Input Single Output), and MIMO (Multiple Input Multiple Output), the transmission device including: an error correction coder that performs error correction coding on each data block having a predetermined length to generate an error correction coded frame; and a mapper that maps the error correction coded frame in a symbol in each predetermined number of bits to generate an error correction coded block. At this point, the mapper maps the transmission system in non-uniform patterns different from each other even if coding rates in the error correction coder are identical to each other.

There is provided a reception device according to a tenth disclosure having a function of conducting communication by at least two transmission systems in SISO (Single Input Single Output), MISO (Multiple Input Single Output), and MIMO (Multiple Input Multiple Output) to receive a signal, which is transmitted while the transmission system is mapped in non-uniform patterns different from each other even if coding rates of error correction coding are identical to each other, the reception device including: a demodulator that detects the transmission system from the transmission signal to demodulate the transmission signal; and a de-mapper that de-maps the detected transmission system based on the mapping of the non-uniform patterns different from each other in each transmission system.

A transmission method according to an eleventh disclosure includes: performing error correction coding on each data block having a predetermined length to generate an error correction coded frame; and mapping the error correction coded frame in a symbol in each predetermined number of bits to generate an error correction coded block. At this point, at least two kinds of the lengths of the error correction coded frame are selectable, and, in the mapping, a first length and a second length of the error correction coded frame are mapped in non-uniform patterns different from each other even if coding rates in the error correction coding are identical to each other.

There is provided a reception method according to a twelfth disclosure for receiving a signal, which is transmitted while a first length and a second length of an error correction coded frame are mapped in non-uniform patterns different from each other even if a coding rate of error correction coding is identical, the reception method including: demodulating the transmission signal; and decoding the length and coding rate of the error correction coded frame from data demodulated in the demodulating, and detecting the mapping of the non-uniform pattern to perform de-mapping.

A transmission method according to a thirteenth disclosure includes: performing error correction coding on each data block having a predetermined length to generate an error correction coded frame; mapping the error correction coded frame in a symbol in each predetermined number of bits to generate an error correction coded block; generating L1 (Layer-1) signaling information in which a transmission parameter is stored, performs the error correction coding on the L1 signaling information to generate an L1 error correction coded frame, and maps the L1 error correction coded frame in the symbol in each predetermined number of bits; and configuring a transmission frame including an error correction coded block output from the mapper and mapping data of L1 signaling information output from the L1 signaling information processing. At this point, in the L1 signaling information processing, the mapping different from the mapping of a non-uniform pattern in the mapper is performed even if a coding rate in the error correction coding of the L1 signaling information is identical to a coding rate in the error correction coding.

There is provided a reception method according to a fourteenth disclosure for receiving a signal, which is transmitted while mapped in non-uniform patterns different from each other even if a coding rate of L1 (Layer-1) signaling information in which a transmission parameter is stored is identical to a coding rate of error correction coding of a transmission stream, the reception method including: demodulating the transmission signal; extracting the L1 signaling information and the transmission stream from data demodulated in the demodulating; and de-mapping the extracted L1 signaling information and the extracted transmission stream based on non-uniform patterns different from each other.

There is provided a transmission method according to a fifteenth disclosure having a function of conducting communication by at least two transmission systems in SISO (Single Input Single Output), MISO (Multiple Input Single Output), and MIMO (Multiple Input Multiple Output), the transmission method including: performing error correction coding on each data block having a predetermined length to generate an error correction coded frame; and mapping the error correction coded frame in a symbol in each predetermined number of bits to generate an error correction coded block. At this point, in the mapping, the transmission system is mapped in non-uniform patterns different from each other even if coding rates in the error correction coder are identical to each other.

There is provided a reception method according to a sixteenth disclosure having a function of conducting communication by at least two transmission systems in SISO (Single Input Single Output), MISO (Multiple Input Single Output), and MIMO (Multiple Input Multiple Output) to receive a signal, which is transmitted while the transmission system is mapped in non-uniform patterns different from each other even if coding rates of error correction coding are identical to each other, the reception method including: detecting the transmission system from the transmission signal to demodulate the transmission signal; and de-mapping the detected transmission system based on the mapping of the non-uniform patterns different from each other in at least two transmission systems.

In the transmission device of the first disclosure, even if the coding rates in the error correction coder are identical to each other, the first length and second length of the error correction coded frame are mapped in the non-uniform patterns different from each other, which allows the shaping gain to be efficiently obtained.

In the transmission device of the second disclosure, when the length and the coding rate of the error correction coded frame are included as the L1 signaling information, even if the coding rates in the error correction coder are identical to each other, the non-uniform patterns different from each other are defined with respect to the first and second lengths of the error correction coded frame, and the receiver can be posted.

In the transmission device of the third disclosure, the demodulator demodulates the transmission signal, and the de-mapper refers to the length and coding rate of the error correction coded frame, and detects the mapping of the non-uniform pattern to perform the de-mapping. Therefore, the signal, which is transmitted while the first length and the second length of the error correction coded frame are mapped in the non-uniform patterns different from each other, can be received even if the coding rates in the error correction coder are identical to each other.

In the transmission device of the fourth disclosure, even if the coding rates of the L1 signaling information and the transmission stream are identical to each other, the shaping gain can efficiently be obtained by performing the mapping in the non-uniform patterns different from each other.

In the transmission device of the fifth disclosure, in the case that the length of the error correction coded frame are different from each other even if the coding rates of the L1 signaling information and the transmission stream are identical to each other, the shaping gain can efficiently be obtained by performing the mapping in the non-uniform patterns different from each other.

In the transmission device of the sixth disclosure, at least one of shortening processing before the error correction coding of the L1 signaling information and puncture processing after the error correction coding of the L1 signaling information is performed even if the coding rates of the L1 signaling information and the transmission stream are identical to each other, the shaping gain can efficiently be obtained by performing the mapping in the non-uniform patterns different from each other.

In the transmission device of the seventh disclosure, when at least one of shortening processing before the error correction coding of the L1 signaling information and puncture processing after the error correction coding of the L1 signaling information is performed even if the coding rate of the L1 signaling information and the transmission stream is identical to each other, and even if the length of the error correction coded frame of them is identical to each other, the shaping gain can efficiently be obtained by performing the mapping in the non-uniform patterns different from each other.

In the reception device of the eighth disclosure, the demodulator demodulates the transmission signal, the extractor extracts the L1 signaling information and the transmission stream, and the de-mapper de-maps the extracted L1 signaling information and transmission stream based on the mapping of the non-uniform patterns different from each other. Therefore, the signal, which is transmitted while mapped in the non-uniform patterns different from each other, can be received even if the coding rates of the L1 signaling information and the transmission stream are identical to each other.

In the transmission device of the ninth disclosure, even if the coding rates of at least two transmission systems in the SISO, the MISO, and the MIMO are identical to each other, the shaping gain can efficiently be obtained by performing the mapping in the non-uniform patterns different from each other.

In the reception device of the tenth disclosure, the demodulator detects the transmission system from the transmission signal to demodulate the transmission signal, and the de-mapper de-maps the detected transmission stream based on the mapping of the non-uniform patterns different from each other in at least two transmission systems. Therefore, the signal, which is transmitted while mapped in the non-uniform patterns different from each other, can be received even if the coding rates of at least two transmission streams in the SISO, the MISO, and the MIMO are identical to each other.

In the transmission method of the eleventh disclosure, even if the coding rates in the error correction coding are identical to each other, the first length and second length of the error correction coded frame are mapped in the non-uniform patterns different from each other, which allows the shaping gain to be efficiently obtained.

In the reception method of the twelfth disclosure, the transmission signal is demodulated in the demodulating, and the mapping of the non-uniform pattern is detected by referring to the length and coding rate of the error correction coded frame, and the de-mapping is performed in the de-mapping. Therefore, the signal, which is transmitted while the first length and the second length of the error correction coded frame are mapped in the non-uniform patterns different from each other, can be received even if the coding rates in the error correction coding are identical to each other.

In the transmission method of the thirteenth disclosure, even if the coding rates of the L1 signaling information and the transmission stream are identical to each other, the shaping gain can efficiently be obtained by performing the mapping in the non-uniform patterns different from each other.

In the reception method of the fourteenth disclosure, the transmission signal is demodulated in the demodulating, the L1 signaling information and the transmission stream are extracted in the extracting, and the extracted L1 signaling information and transmission stream are de-mapped based on the mapping of the non-uniform patterns different from each other in the de-mapping. Therefore, the signal, which is transmitted while mapped in the non-uniform patterns different from each other, can be received even if the coding rates of the L1 signaling information and the transmission stream are identical to each other.

In the transmission method of the fifteenth disclosure, even if the coding rates of at least two transmission systems in the SISO, the MISO, and the MIMO are identical to each other, the shaping gain can efficiently be obtained by performing the mapping in the non-uniform patterns different from each other.

In the reception method of the sixteenth disclosure, the transmission system is detected from the transmission signal to demodulate the transmission signal in the demodulating, and the detected transmission stream is de-mapped based on the mapping of the non-uniform patterns different from each other in at least two transmission systems in the de-mapping. Therefore, the signal, which is transmitted while mapped in the non-uniform patterns different from each other, can be received even if the coding rates of at least two transmission streams in the SISO, the MISO, and the MIMO are identical to each other.

Hereinafter, exemplary embodiments of the present disclosure will be described in detail with reference to the drawings.

First Exemplary Embodiment

<Transmission Device and Transmission Method>

Figure 1:
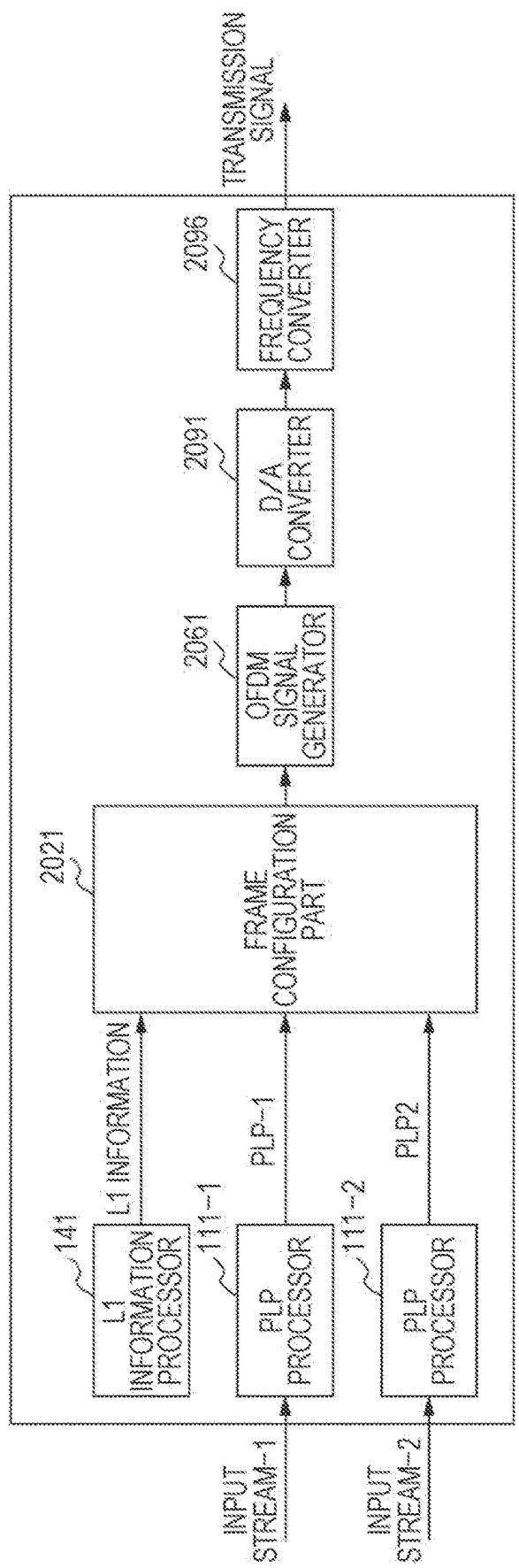
FIG. 1 is a view illustrating a configuration of transmission device 100 according to a first exemplary embodiment.

FIG. 1 is a view illustrating a configuration of transmission device 100 according to a first exemplary embodiment of the present disclosure. The same component as the conventional transmission device is designated by the same reference mark, and the description is omitted. The case that not only the 16 k mode but also the 64 k mode are used as the code length of the LDPC coding with respect to the data PLP will be described in the first exemplary embodiment.

Transmission device 100 in FIG. 1 differs from conventional transmission device 2000 in FIG. 25 in the configuration in which PLP processor 2011 and L1 information processor 2041 are replaced with PLP processor 111 and L1 information processor 141, respectively.

The operation of transmission device 100 will be described below. PLP processor 111 for each PLP adapts each input stream to the PLP, performs the processing associated with PLP, and outputs the mapping data (cell) of each PLP.

Figure 2:
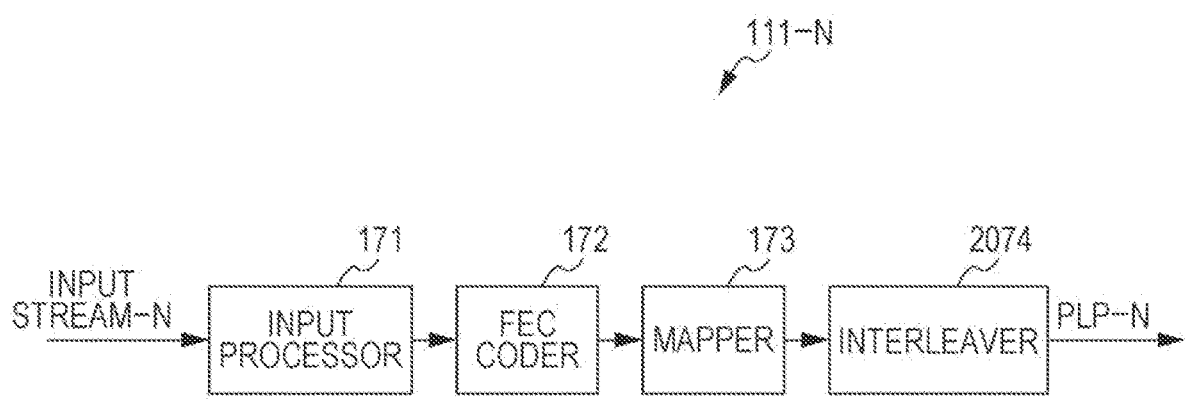
FIG. 2 is a view illustrating a configuration of PLP processor 111 of the first exemplary embodiment.

FIG. 2 is a view illustrating a configuration of PLP processor 111. PLP processor 111 in FIG. 2 differs from conventional PLP processor 2011 in FIG. 26 in the configuration in which input processor 2071, FEC coder 2072, and mapper 2073 are replaced with input processor 171, FEC coder 172, and mapper 173, respectively.

In PLP processor 111 of FIG. 2, input processor 171 converts the input stream into the baseband frame based on whether the code length of the LDPC coding is the 16 k mode or the 64 k mode. Based on whether the code length of the LDPC coding is the 16 k mode or the 64 k mode, FEC coder 172 adds a parity bit by performing the BCH coding and the LDPC coding in each baseband frame, thereby generating the FEC frame. Mapper 173 performs the mapping in the I-Q coordinate to perform the conversion into the FEC block, and outputs the pieces of mapping data (cell).

Figure 3:
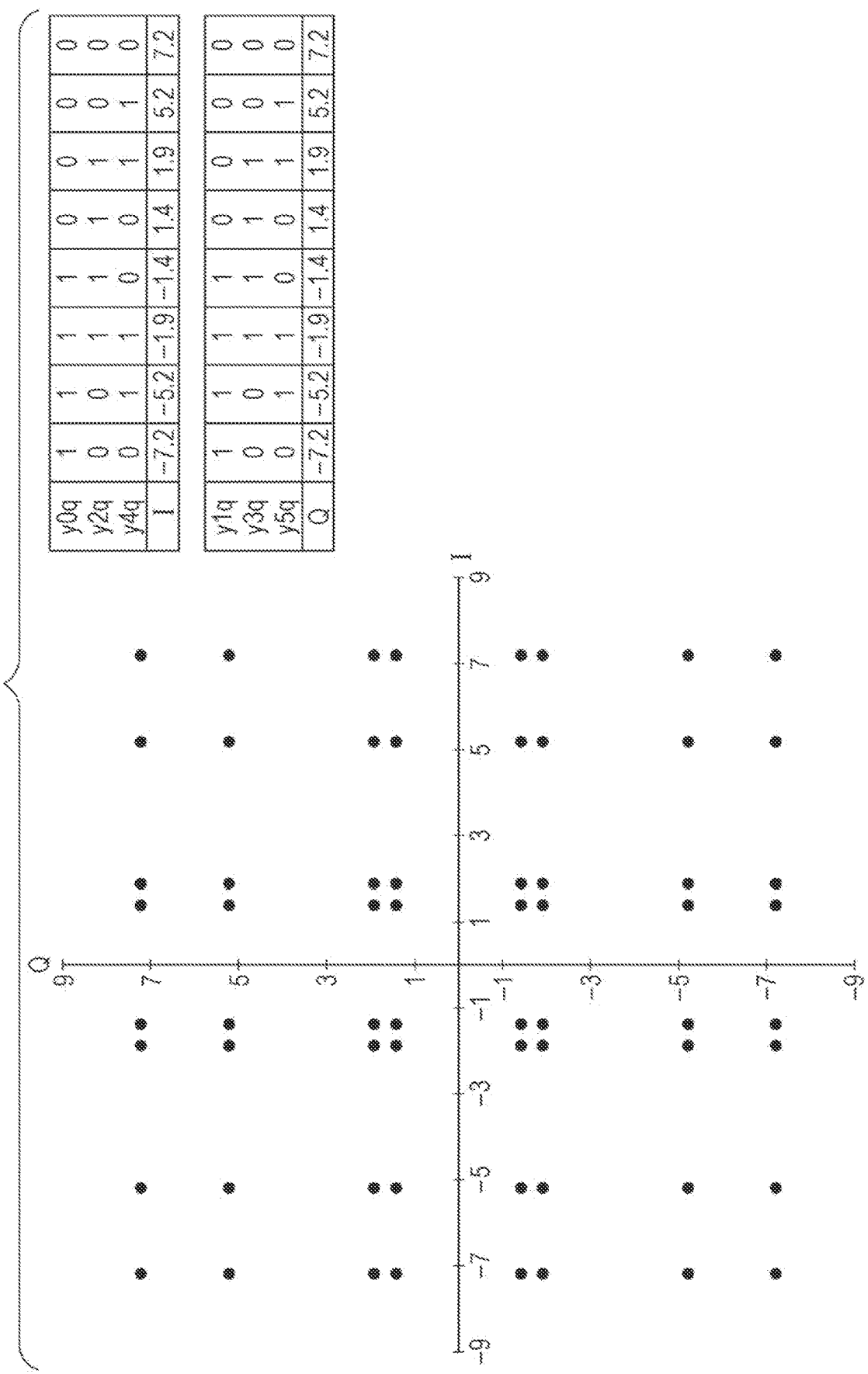
FIG. 3 is a view illustrating a 64QAM (coding rate of 2/5) constellation arrangement of a non-uniform mapping pattern when a code length of LDPC coding is a 64 k mode in the first exemplary embodiment.

FIG. 3 is a view illustrating the 64QAM (coding rate of 2/5) constellation arrangement of the non-uniform mapping pattern when the code length of the LDPC coding is the 64 k mode. For the 16 k mode, the non-uniform mapping pattern in FIG. 29 is used similarly to the DVB-NGH system. As illustrated in FIG. 3, the non-uniform mapping for the 16 k mode is not directly used in the 64 k mode, but the non-uniform mapping of a one-rank-lower coding rate of 1/3 is used. This is because the 64 k mode having the long code length has the error correction capability higher than that of the 16 k mode having the short code length to decrease the required C/N ratio.

FIG. 4 illustrates the I-Q coordinate of the 64QAM (all coding rates) constellation arrangement of the non-uniform mapping pattern when the code length of LDPC coding is the 64 k mode in the first exemplary embodiment. For the 16 k mode, the non-uniform mapping pattern in FIG. 30 is used similarly to the DVB-NGH system. As illustrated in FIG. 4, the non-uniform mapping for the 16 k mode is not directly used in the 64 k mode, but the non-uniform mapping of the one-rank-lower coding rate is used in each 64 k mode. New non-uniform mapping is defined for the coding rate of 1/3.

L1 information processor 141 in FIG. 1 performs the processing associated with the L1 information, and outputs the mapping data of the L1 information.

Figures 5, 6:
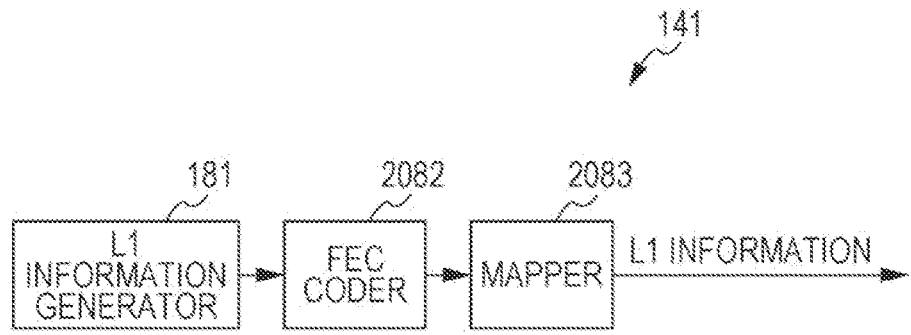
FIG. 5 is a view illustrating a configuration of L1 information processor 141 of the first exemplary embodiment.
FIG. 6 is a view illustrating L1 information included in a PLP loop in an L1-post (configurable) of the first exemplary embodiment.

FIG. 5 illustrates a configuration of L1 information processor 141. L1 information processor 141 in FIG. 5 differs from conventional L1 information processor 2041 in FIG. 27 in the configuration in which L1 information generator 2081 is replaced with L1 information generator 181.

In L1 information processor 141 of FIG. 5, L1 information generator 181 generates the transmission parameters to perform the conversion into the L1-pre information and L1-post information. FIG. 6 illustrates the L1 information included in a PLP loop in the L1-post (configurable). FIG. 6 illustrates whether the code length of the LDPC coding is the 16 k mode or the 64 k mode by PLP_FEC_TYPE in each PLP. Each PLP includes PLP_COD indicating the coding rate, PLP_NON_UNIFORM_CONST indicating whether the mapping is uniform or non-uniform, and PLP_MOD indicating the modulation method. Different non-uniform mapping patterns can be defined with respect to different LDPC code lengths having the same coding rate by including the L1 information, and posted to the receiver.

According to the above configuration, in the transmission technology in which the modulation having the non-uniform mapping pattern is used, the transmission device, transmission method, and program for efficiently obtaining the shaping gain can be provided by defining the different non-uniform mapping patterns with respect to the different LDPC code lengths having the same coding rate.

<Reception Device and Reception Method>

Figure 7:
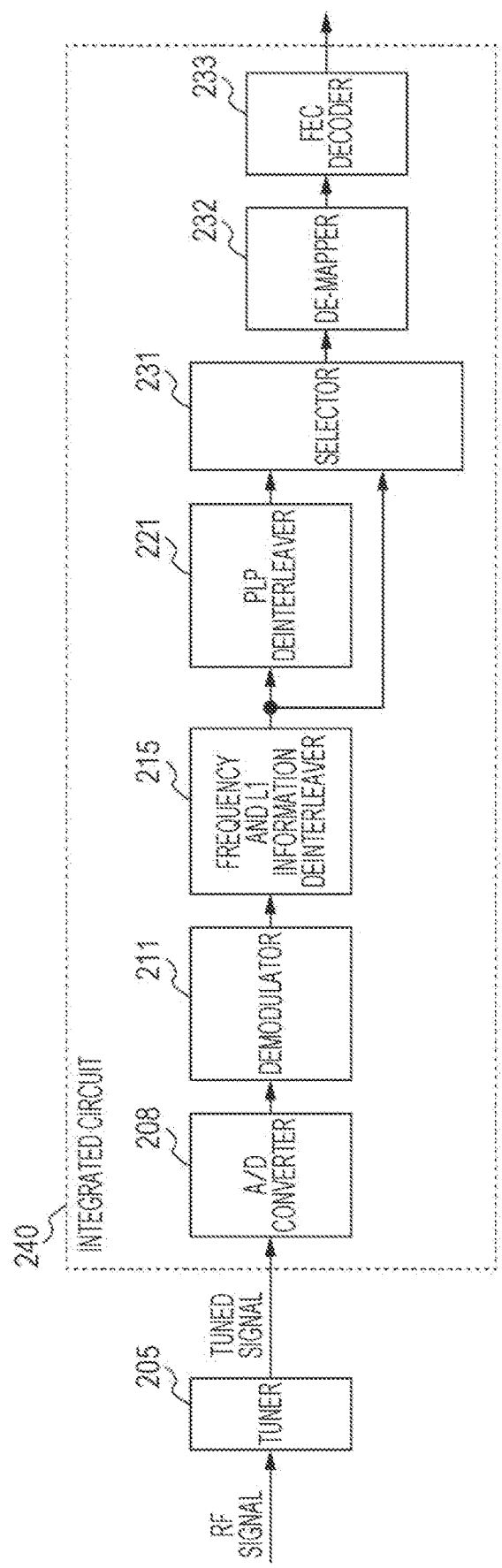
FIG. 7 is a view illustrating a configuration of reception device 200 of the first exemplary embodiment.

FIG. 7 is a view illustrating a configuration of reception device 200 in the first exemplary embodiment of the present disclosure. Reception device 200 in FIG. 7 corresponds to transmission device 100 in FIG. 1, and reflects the function of transmission device 100.

Reception device 200 includes tuner 205, A/D converter 208, demodulator 211, frequency and L1 information deinterleaver 215, PLP deinterleaver 221, selector 231, de-mapper 232, and FEC decoder 233.

The operation of reception device 200 will be described below. When an analog RF reception signal is input through a reception antenna, tuner 205 selectively receives a signal of a tuned frequency channel, and performs down-conversion to a predetermined band. A/D converter 208 performs A/D conversion to output a digital reception signal. Demodulator 211 performs OFDM demodulation to output cell data of the I-Q coordinate and a channel estimated value. Frequency and L1 information deinterleaver 215 frequency-deinterleaves the cell data and channel estimated value of the PLP including the tuned program data, and deinterleaves the cell data and channel estimated value of the L1 information. Selector 231 selects the deinterleaved cell data and channel estimated value of the L1 information. De-mapper 232 performs de-mapping processing, and FEC decoder 233 performs LDPC decoding processing and BCH decoding processing. Therefore, the L1 information is decoded.

Based on scheduling information included in the decoded L1 information, PLP deinterleaver 221 extracts the cell data and channel estimated value of the PLP (for example, PLP-1 in FIG. 1) including the program selected by a user, and performs the rearrangement opposite to the transmission-side interleaving processing. Selector 231 selects the deinterleaved cell data and channel estimated value of the PLP-1.

De-mapper 232 performs de-mapping processing on the cell data and channel estimated value of the PLP output from selector 231, and FEC decoder 233 performs the LDPC decoding processing and the BCH decoding processing. Therefore, the PLP data is decoded.

When performing the de-mapping processing, de-mapper 232 refers to PLP_FEC_TYPE, PLP_COD, PLP_NON_UNIFORM_CONST, and PLP_MOD in FIG. 6 with respect to the PLP (for example, PLP-1 in FIG. 1) including the program selected by the user from the decoded L1 information. Therefore, even if transmission device 100 in FIG. 1 defines the different non-uniform mapping patterns with respect to the LDPC code lengths having the same coding rate, de-mapper 232 can detect the mapping pattern, and perform the de-mapping processing based on the detected mapping pattern.

Integrated circuit 240 may be fabricated while including components except for tuner 205 in reception device 200 of FIG. 7.

According to the above configuration, the reception device, reception method, integrated circuit, and program for receiving the transmission signals in which the different non-uniform mapping patterns are defined with respect to the different LDPC code lengths having the same coding rate can be provided in the transmission technology in which the modulation having the non-uniform mapping pattern is used.

Second Exemplary Embodiment

<Transmission Device and Transmission Method>

Figure 8:
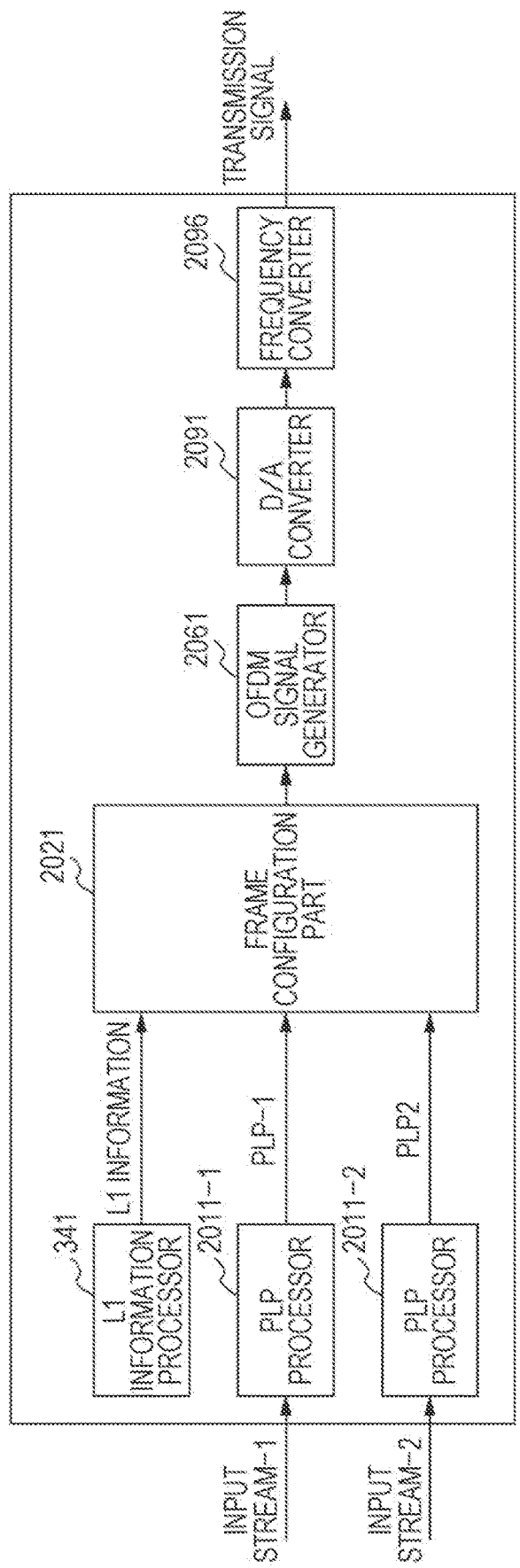
FIG. 8 is a view illustrating a configuration of transmission device 300 according to a second exemplary embodiment.

FIG. 8 is a view illustrating a configuration of transmission device 300 according to a second exemplary embodiment of the present disclosure. The same component as the conventional transmission device and transmission device of the first exemplary embodiment is designated by the same reference mark, and the description is omitted. The case that the code length of the LDPC coding for the L1 information is the 4 k mode similarly to the DVB-NGH system will be described in the second exemplary embodiment.

Transmission device 300 in FIG. 8 differs from conventional transmission device 2000 in FIG. 25 in the configuration in which L1 information processor 2041 is replaced with L1 information processor 341.

Figures 9, 10:
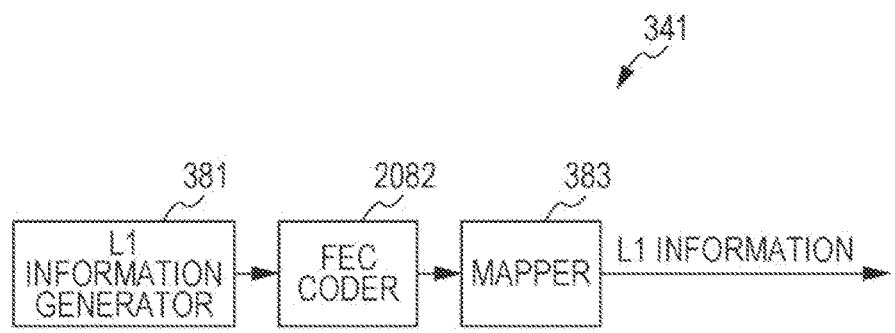
FIG. 9 is a view illustrating a configuration of L1 information processor 341 of the second exemplary embodiment.
FIG. 10 is a view illustrating L1 information about L1-post included in the L1-pre in the second exemplary embodiment.

FIG. 9 is a view illustrating a configuration of L1 information processor 341. L1 information processor 341 in FIG. 9 differs from conventional L1 information processor 2041 in FIG. 27 in the configuration in which L1 information generator 2081 and mapper 2083 are replaced with L1 information generator 381 and mapper 383, respectively.

In L1 information processor 341 of FIG. 9, L1 information generator 381 generates the transmission parameters to perform the conversion into the L1-pre information and L1-post information. FIG. 10 illustrates the L1 information about the L1-post included in the L1-pre. L1_POST_FEC_TYPE indicates that the code length of the LDPC coding is the 4 k mode. L1_POST_COD indicating the coding rate, L1_POST_NON_UNIFORM_CONST indicating whether the mapping is uniform or non-uniform, and L1_POST_MOD indicating the modulation method are also included. In the case that the L1-post has the LDPC code length different from the data PLP and the same coding rate as the PLP, the different non-uniform mapping pattern can be defined by including the L1 information about the L1-post, and posted to the receiver.

In L1 information processor 341 of FIG. 9, mapper 383 performs the mapping in the I-Q coordinate to perform the conversion into the FEC block, and outputs pieces of mapping data (cell).

Figure 11:
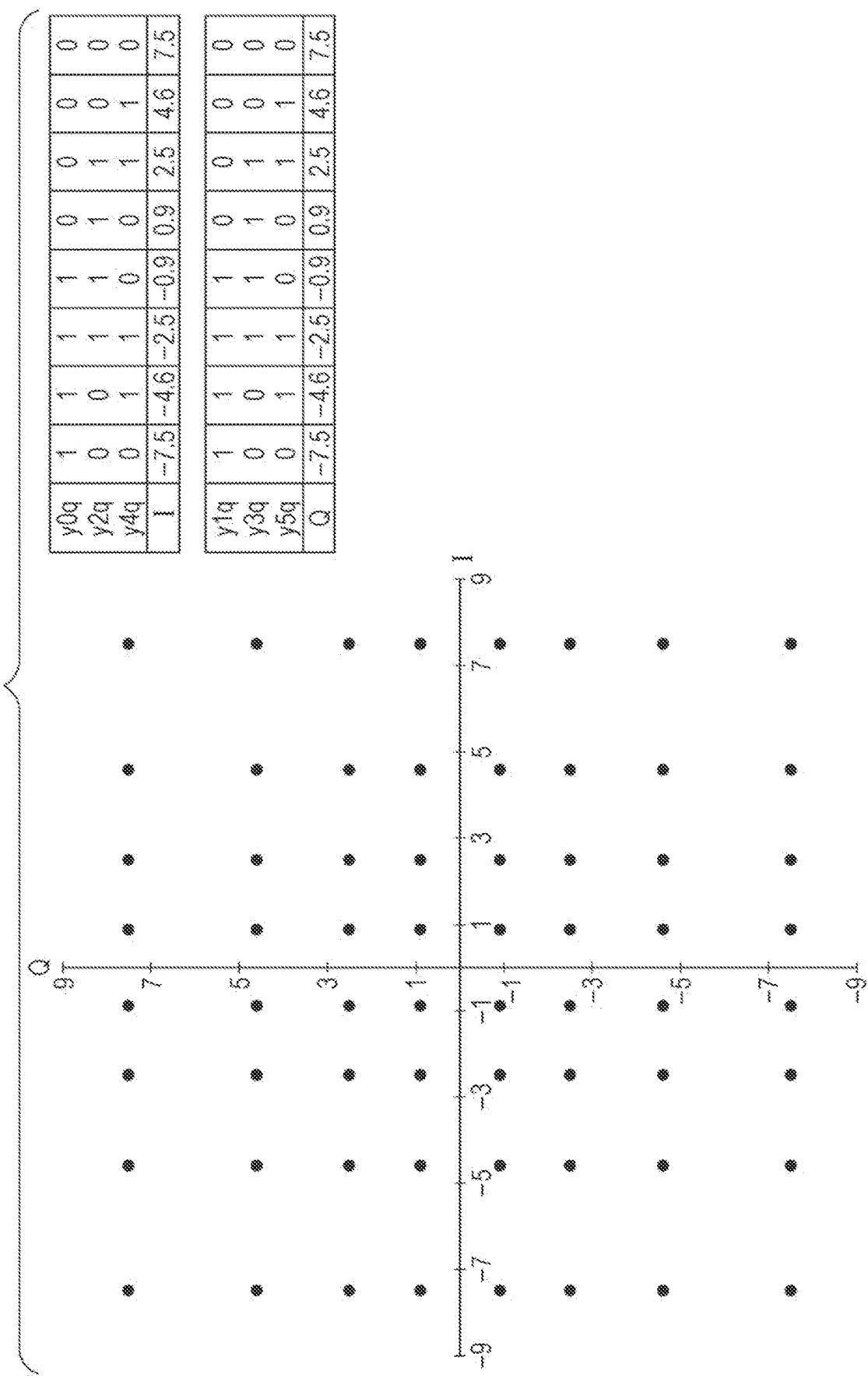
FIG. 11 is a view illustrating the 64QAM (coding rate of 7/15) constellation arrangement of the non-uniform mapping pattern in the L1-post in the second exemplary embodiment.

FIG. 11 is a view illustrating the 64QAM (coding rate of 7/15) constellation arrangement of the non-uniform mapping pattern in the L1-post. As illustrated in FIG. 11, the non-uniform mapping for the data PLP (16 k mode) is not directly used in the 4 k mode of the L1-post, but the non-uniform mapping of a two-rank-higher coding rate of 3/5 is used. This is because the 4 k mode having the short code length has the error correction capability lower than that of the 16 k mode having the long code length to increase the required C/N ratio. In the L1-post, the non-uniform mapping of not a one-rank-higher coding rate of 8/15, but the two-rank-higher coding rate of 3/5 is used in consideration of the error correction capability degradation due to a small number of information bits.

According to the above configuration, the transmission device, transmission method, and program for efficiently obtaining the shaping gain by defining the different non-uniform mapping patterns can be provided in the case that the L1 information has the LDPC code length different from the data PLP and the same coding rate as the data PLP in the transmission technology in which the modulation having the non-uniform mapping pattern is used.

<Reception Device and Reception Method>

Figure 12:
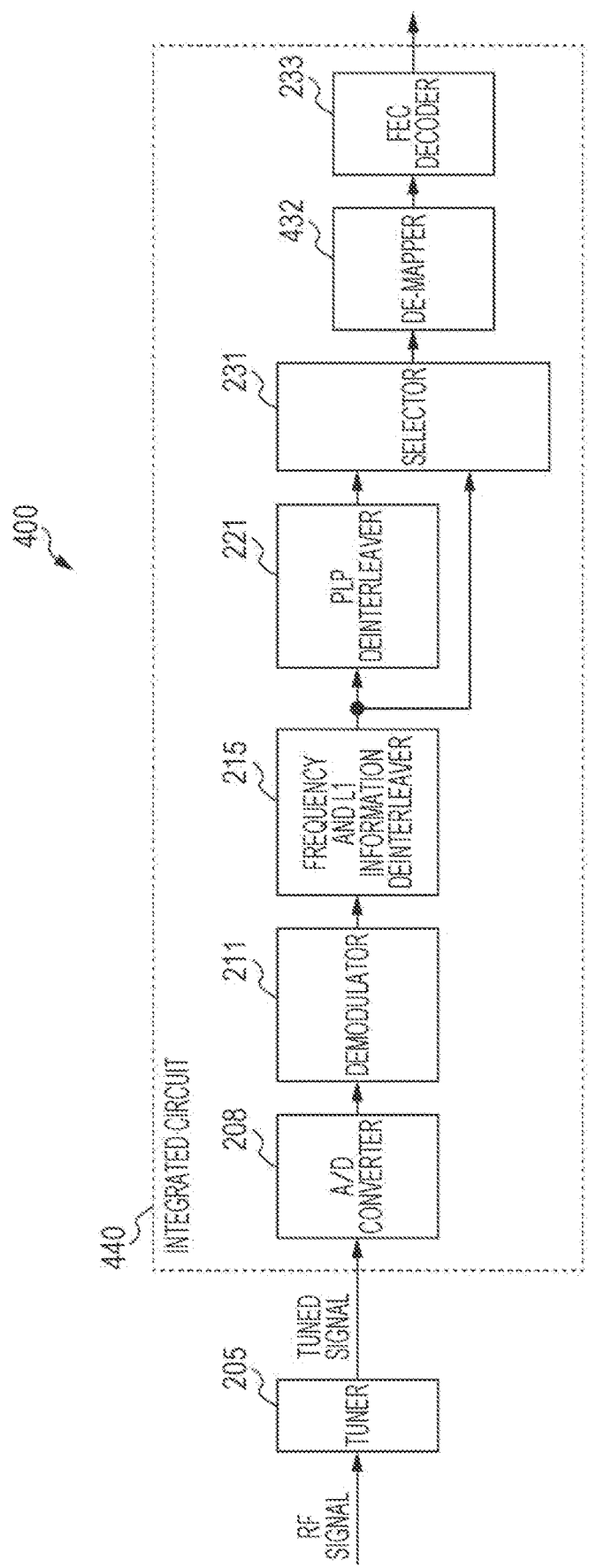
FIG. 12 is a view illustrating a configuration of reception device 400 of the second exemplary embodiment.

FIG. 12 is a view illustrating a configuration of reception device 400 in the second exemplary embodiment of the present disclosure. Reception device 400 in FIG. 12 corresponds to transmission device 300 in FIG. 8, and reflects the function of transmission device 300. The same component as transmission device 200 of the first exemplary embodiment is designated by the same reference mark, and the description is omitted.

Reception device 400 in FIG. 12 differs from reception device 200 of the first exemplary embodiment in FIG. 7 in the configuration in which de-mapper 232 is replaced with de-mapper 432.

The operation of reception device 200 will be described below. Selector 231 selects the cell data and channel estimated value of the L1 information deinterleaved by frequency and L1 information deinterleaver 215. De-mapper 432 performs the de-mapping processing on the L1-pre, and FEC decoder 233 performs the LDPC decoding processing and the BCH decoding processing. Therefore, the L1-pre information is decoded.

In performing the de-mapping processing on the L1-post, de-mapper 432 refers to L1_POST_FEC_TYPE, L1_POST_COD, L1_POST_NON_UNIFORM_CONST, and L1_POST_MOD in FIG. 10 from the decoded L1-pre information. Therefore, even if transmission device 300 in FIG. 8 defines the different non-uniform mapping patterns while the L1-post and the data PLP have the different LDPC code lengths and the same coding rate, de-mapper 432 can detect the mapping patterns of both the L1-post and the data PLP, and perform the de-mapping processing based on the detected mapping patterns. FEC decoder 233 performs the LDPC decoding processing and the BCH decoding processing on the L1-post subjected to the de-mapping processing. Therefore, the L1-post information is decoded.

The operations performed for the data PLP by the components from PLP deinterleaver 221 are similar to those of the first exemplary embodiment.

Integrated circuit 440 may be fabricated while including components except for tuner 205 in reception device 400 of FIG. 12.

According to the above configuration, the reception device, reception method, integrated circuit, and program for receiving the transmission signals in which the different non-uniform mapping patterns are defined can be provided in the case that the L1 information has the LDPC code length different from the data PLP and the same coding rate as the data PLP in the transmission technology in which the modulation having the non-uniform mapping pattern is used.

<Modifications of Transmission Device and Transmission Method>

Figures 13, 14:
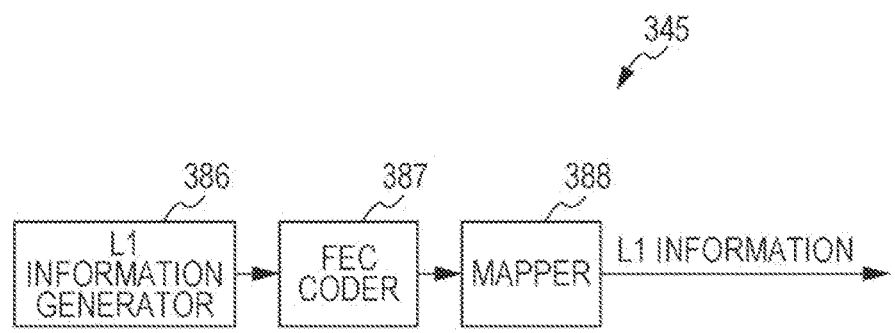
FIG. 13 is a view illustrating a configuration of L1 information processor 345 according to a modification of the second exemplary embodiment.
FIG. 14 is a view illustrating L1 information about the L1-post included in the L1-pre in the modification of the second exemplary embodiment.

L1 information processor 341 in FIG. 9 may be replaced with L1 information processor 345 in FIG. 13. The case that the 16 k mode is used as the code length of the LDPC coding for the L1 information similarly to the data PLP will be described in the modification.

L1 information processor 345 in FIG. 13 differs from L1 information processor 341 in FIG. 9 in the configuration in which L1 information generator 381, FEC coder 2087, and mapper 383 are replaced with L1 information generator 386, FEC coder 387, and mapper 388, respectively.

In L1 information processor 345 of FIG. 13, L1 information generator 386 generates the transmission parameters to perform the conversion into the L1-pre information and L1-post information. FIG. 14 illustrates the L1 information about the L1-post included in the L1-pre. L1_POST_FEC_TYPE indicates that the code length of the LDPC coding is the 16 k mode. Other pieces of L1 information are similar to those in FIG. 10.

In L1 information processor 345 of FIG. 13, FEC coder 387 adds the parity bit by performing the BCH coding and the LDPC coding in each of the L1-pre information and the L1-post information using the 16 k mode.

Mapper 388 performs the mapping in the I-Q coordinate to perform the conversion into the FEC block, and outputs the pieces of mapping data (cells).

Figure 15:
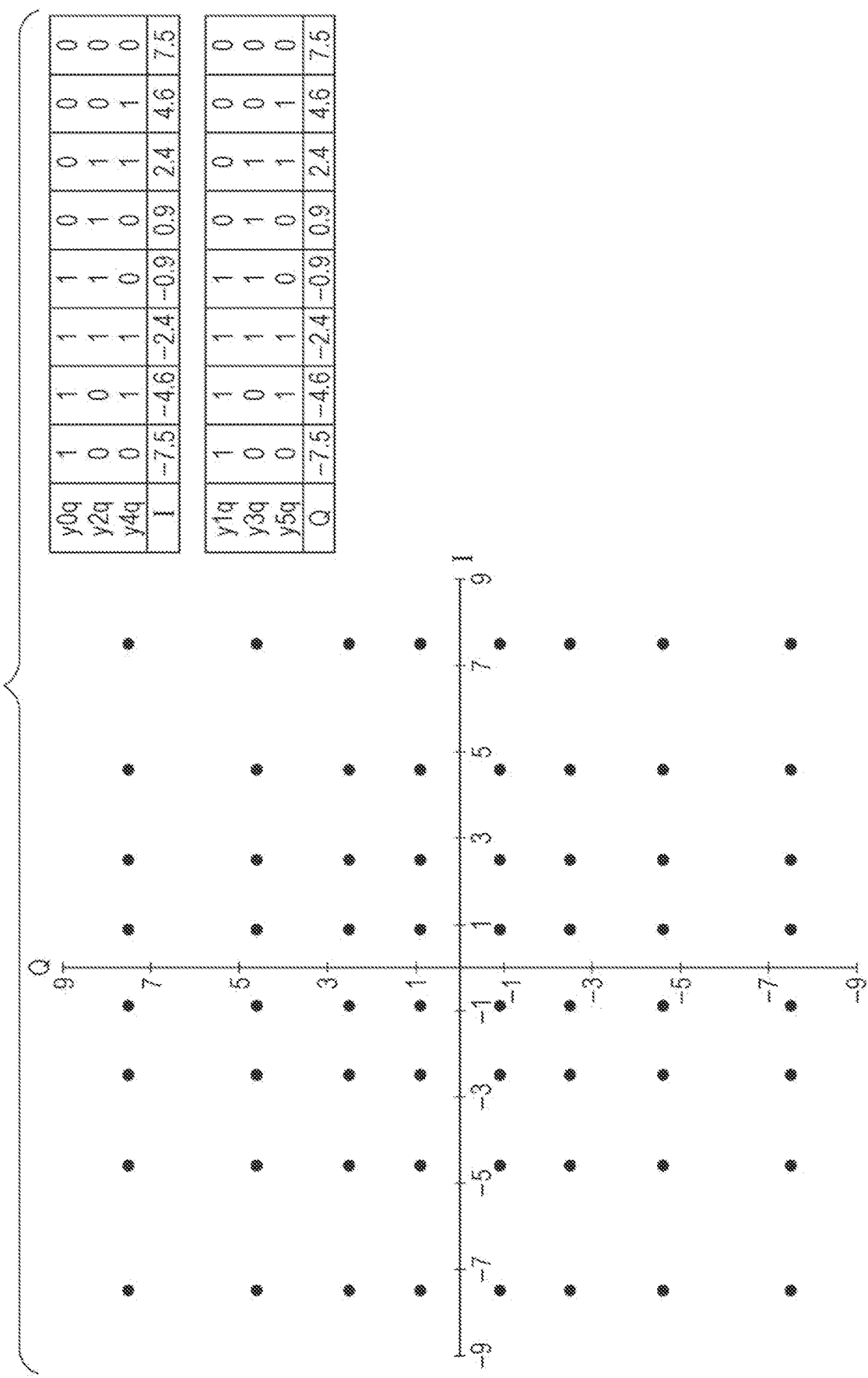
FIG. 15 is a view illustrating a 64QAM (coding rate of 7/15) constellation arrangement of the non-uniform mapping pattern in the L1-post in the modification of the second exemplary embodiment.

FIG. 15 is a view illustrating the 64QAM (coding rate of 7/15) constellation arrangement of the non-uniform mapping pattern in the L1-post. As illustrated in FIG. 15, the non-uniform mapping for the data PLP (16 k mode) is not directly used in the L1-post (16 k mode), but the non-uniform mapping of the one-rank-higher coding rate of 8/15 is used. This is because the error correction capability degradation due to the small number of information bits is considered in the L1-post even in the same code length.

According to the above configuration, the transmission device, transmission method, and program for efficiently obtaining the shaping gain by defining the different non-uniform mapping patterns can be provided in the case that the L1 information has the same LDPC code length as the data PLP and the same coding rate as the data PLP in the transmission technology in which the modulation having the non-uniform mapping pattern is used.

<Modification of Reception Device and Reception Method>

Figure 16:
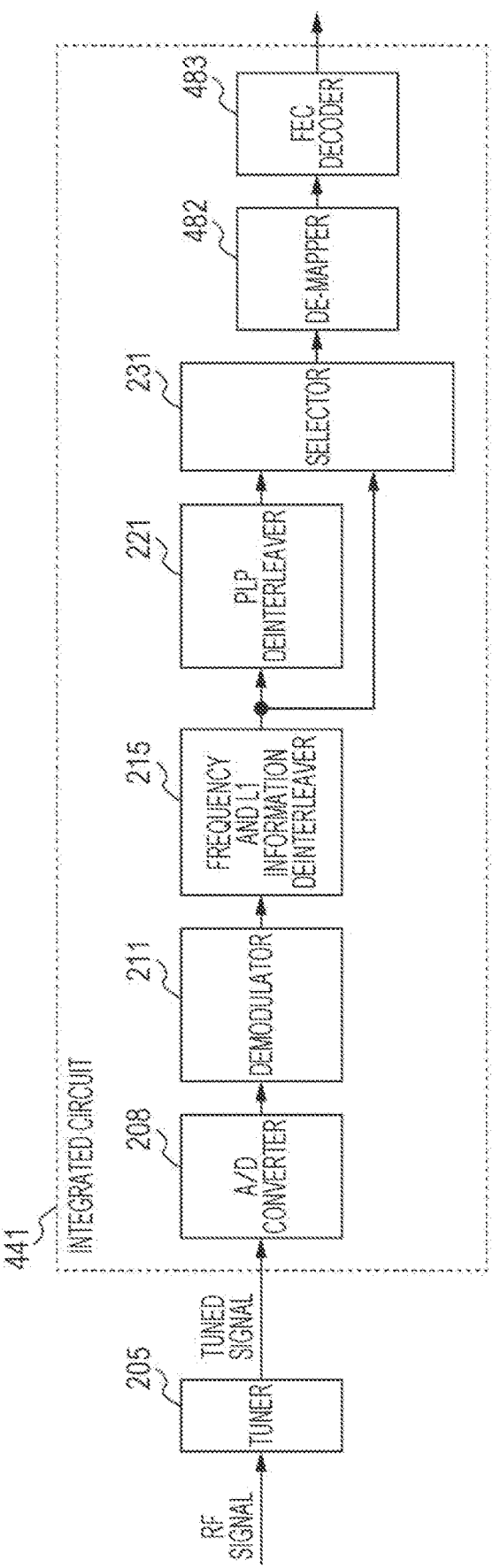
FIG. 16 is a view illustrating a configuration of reception device 450 according to a modification of the second exemplary embodiment.

FIG. 16 illustrates a configuration of reception device 450 when L1 information processor 345 in FIG. 13 is adopted. Reception device 450 in FIG. 16 differs from reception device 400 in FIG. 12 in the configuration in which de-mapper 432 and FEC decoder 233 are replaced with de-mapper 482 and FEC decoder 483, respectively.

In reception device 450 of FIG. 16, using the 16 k mode, FEC decoder 483 performs the LDPC decoding processing and the BCH decoding processing on the L1-pre subjected to the de-mapping processing. Therefore, the L1-pre information is decoded.

In performing the de-mapping processing on the L1-post, de-mapper 482 refers to L1_POST_FEC_TYPE, L1_POST_COD, L1_POST_NON_UNIFORM_CONST, and L1_POST_MOD in FIG. 14 from the decoded L1-pre information. Therefore, even if the transmission device defines the different non-uniform mapping patterns while the L1-post and the data PLP have the same LDPC code lengths and the same coding rate, de-mapper 482 can detect the mapping patterns of both the L1-post and the data PLP, and perform the de-mapping processing based on the detected mapping patterns.

FEC decoder 483 performs the LDPC decoding processing and the BCH decoding processing on the L1-post subjected to the de-mapping processing. Therefore, the L1-post information is decoded.

The operations performed for the data PLP by the components from PLP deinterleaver 221 are similar to those of the reception device 400 in FIG. 12.

Integrated circuit 441 may be fabricated while including components except for tuner 205 in reception device 450 of FIG. 16.

According to the above configuration, the reception device, reception method, integrated circuit, and program for receiving the transmission signals in which the different non-uniform mapping patterns are defined can be provided in the case that the L1 information has the same LDPC code length as the data PLP and the same coding rate as the data PLP in the transmission technology in which the modulation having the non-uniform mapping pattern is used.

Third Exemplary Embodiment

<Transmission Device and Transmission Method>

Figure 17:
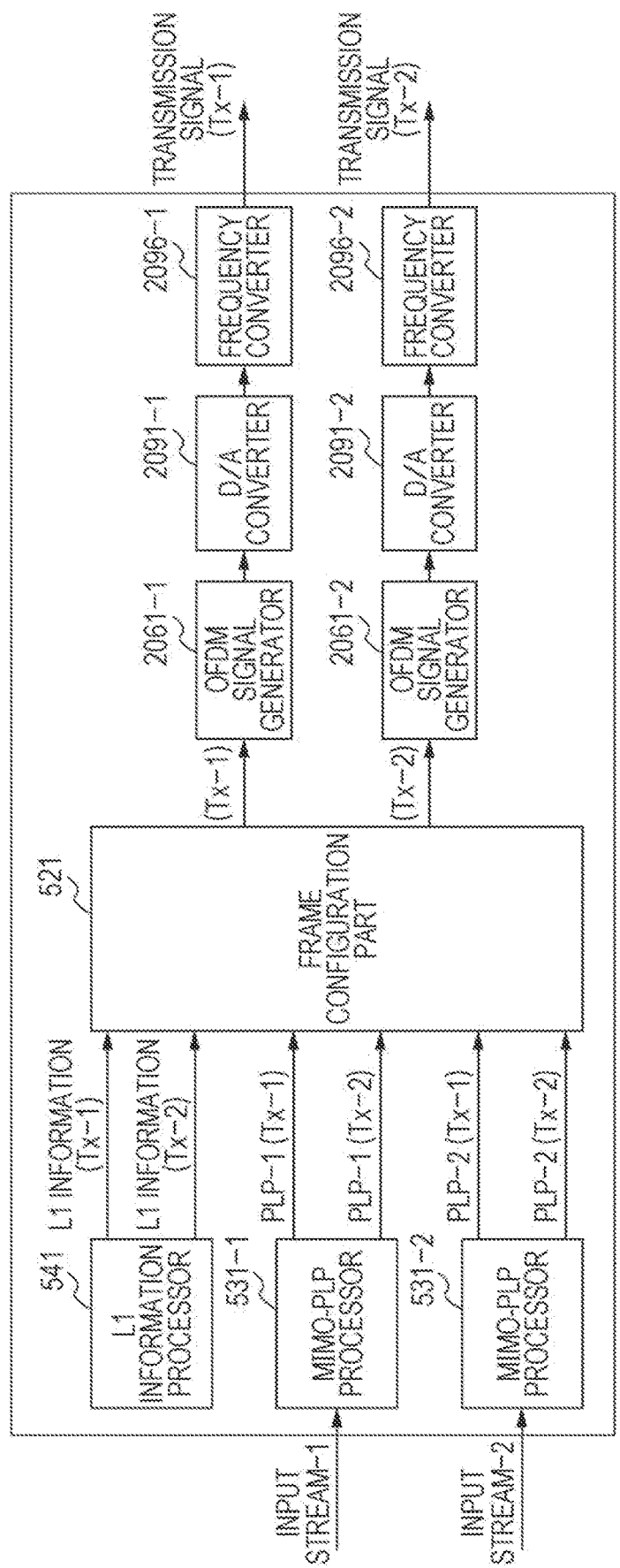
FIG. 17 is a view illustrating a configuration of transmission device 500 according to a third exemplary embodiment.

FIG. 17 is a view illustrating a configuration of transmission device 500 according to a third exemplary embodiment of the present disclosure. The same component as the conventional transmission device and transmission devices of the first and second exemplary embodiments is designated by the same reference mark, and the description is omitted. The MIMO profile in the DVB-NGH system will be described in the third exemplary embodiment.

Transmission device 500 in FIG. 17 differs from conventional transmission device 2000 in FIG. 25 in the configuration in which PLP processor 2011, frame configuration part 2021, and L1 information processor 2041 are replaced with MIMO-PLP processor 531, frame configuration part 521, and L1 information processor 541, respectively. Transmission device 500 also includes OFDM signal generator 2061D/A converter 2091, and frequency converter 2096 in each of the transmission antennas (Tx-1 and Tx-2).

Figure 18:
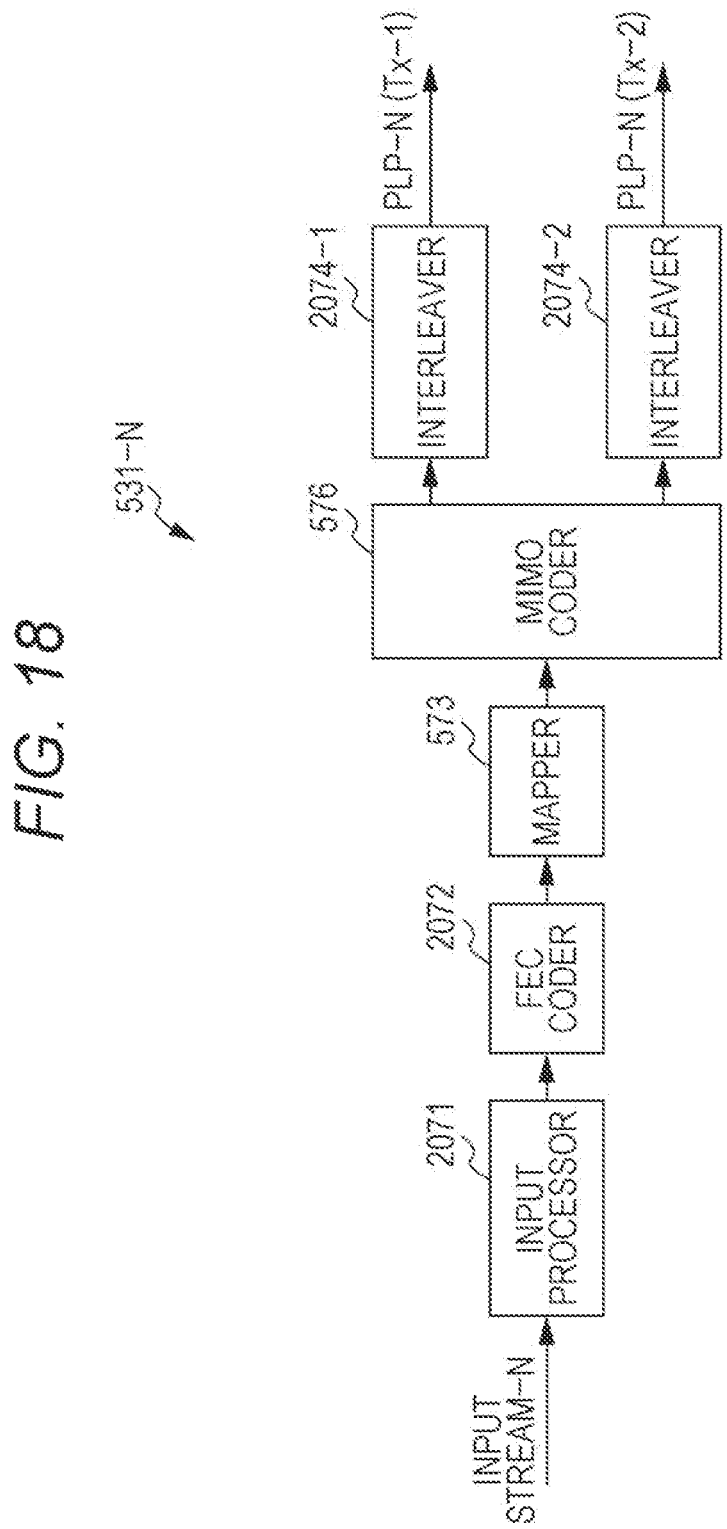
FIG. 18 is a view illustrating a configuration of MIMO-PLP processor 531 of the third exemplary embodiment.

FIG. 18 is a view illustrating a configuration of MIMO-PLP processor 531. MIMO-PLP processor 531 in FIG. 18 differs from conventional PLP processor 2011 in FIG. 26 in the configuration in which mapper 2073 is replaced with mapper 573, in which MIMO coder 576 is added, and in which interleaver 2074 is included in each of the two transmission antennas.

In MIMO-PLP processor 531 of FIG. 18, mapper 573 performs the mapping in the I-Q coordinate to perform the conversion into the FEC block, and outputs pieces of mapping data (cell).

Figure 19:
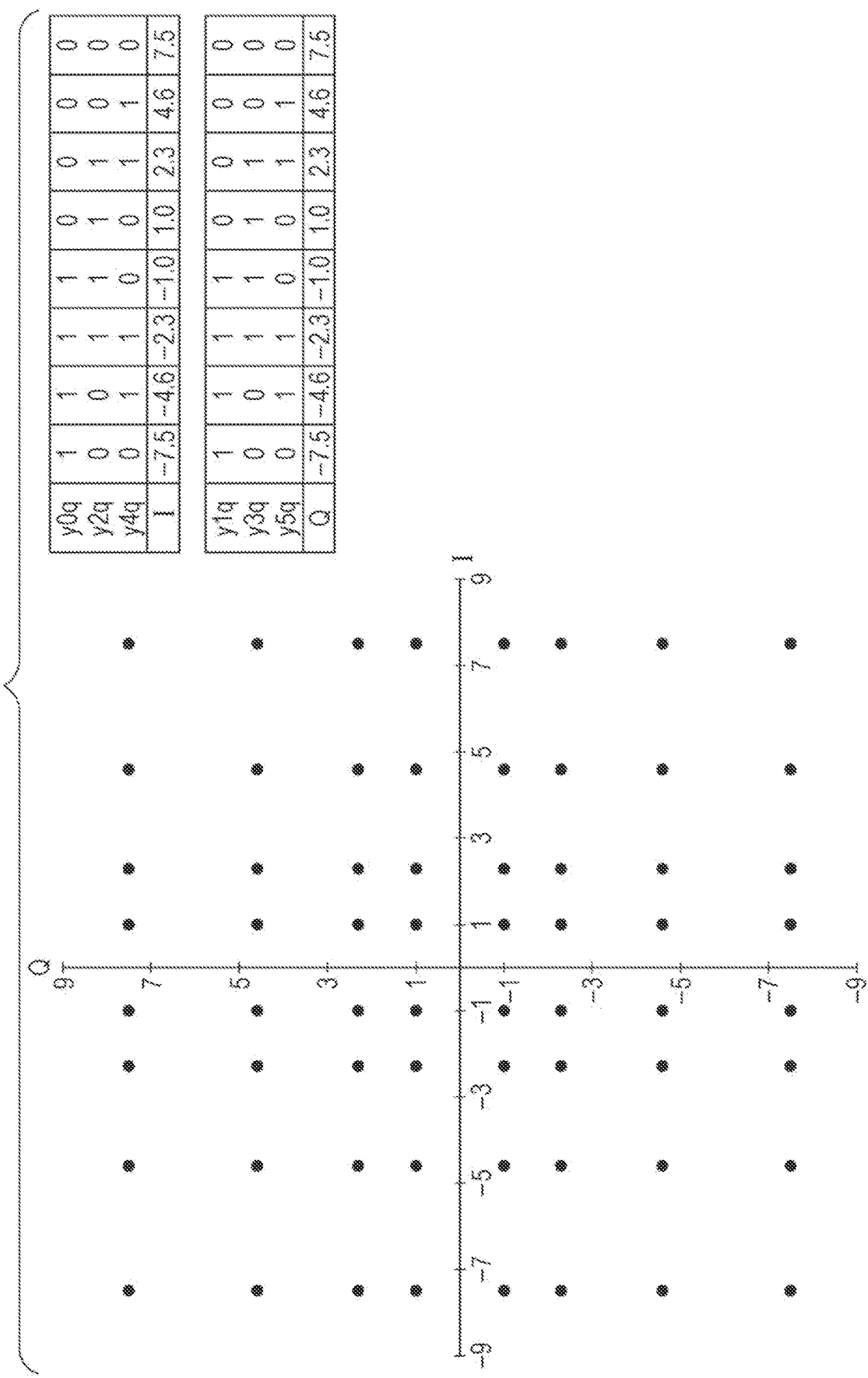
FIG. 19 is a view illustrating the 64QAM (coding rate of 2/5) constellation arrangement of the non-uniform mapping pattern in an MIMO profile in the third exemplary embodiment.

FIG. 19 is a view illustrating the 64QAM (coding rate of 2/5) constellation arrangement of the non-uniform mapping pattern in the MIMO profile. As illustrated in FIG. 19, the non-uniform mapping for the SISO frame of the base profile is not directly used in the MIMO profile, but the non-uniform mapping of a one-rank-higher coding rate of 7/15 is used. The MIMO is the parallel transmission in which the plurality of transmission and reception antennas are used. In the MIMO, the required C/N ratio increases because the influence of interference between the antennas is not completely removed.

FIG. 20 illustrates the I-Q coordinate of the 64QAM (all coding rates) constellation arrangement of the non-uniform mapping pattern in the MIMO profile in the third exemplary embodiment. As illustrated in FIG. 20, the non-uniform mapping for the SISO frame of the base profile is not directly used in the MIMO profile, but the non-uniform mapping of the one-rank-higher coding rate is used. New non-uniform mapping is defined for the coding rate of 11/15.

In MIMO-PLP processor 531 of FIG. 18, MIMO coder 576 performs MIMO coding on the pieces of mapping data (cells) output from mapper 573. Interleaver 2074 for each of the two transmission antennas rearranges the pieces of mapping data (cell) in the TI block including the integral number of FEC blocks.

Figures 21, 22:
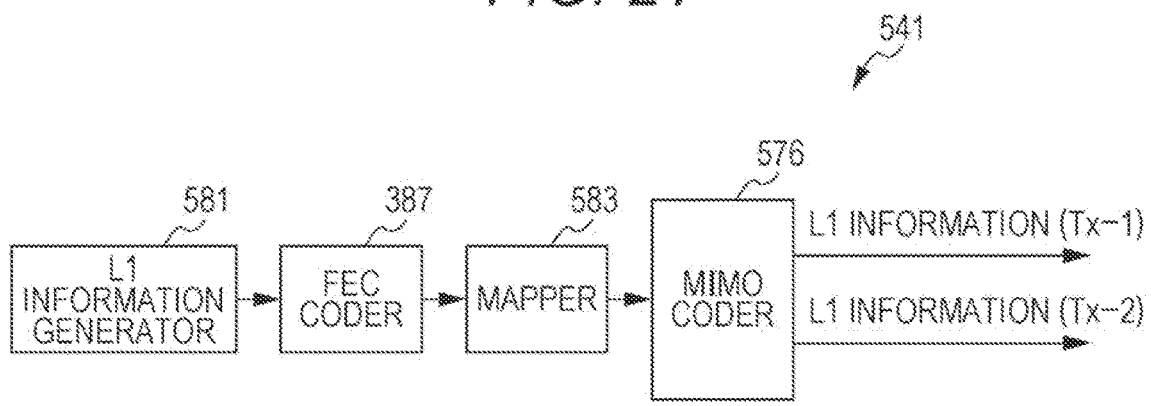
FIG. 21 is a view illustrating a configuration of L1 information processor 541 of the third exemplary embodiment.
FIG. 22 is a view illustrating the L1 information included in the PLP loop in the L1-post (configurable) of the third exemplary embodiment.

FIG. 21 is a view illustrating a configuration of L1 information processor 541. L1 information processor 541 in FIG. 21 differs from conventional L1 information processor 2041 in FIG. 27 in the configuration in which L1 information generator 2081, FEC coder 2082, and mapper 2083 are replaced with L1 information generator 581, FEC coder 387, and mapper 583, respectively and in which MIMO coder 576 is added.

In L1 information processor 541 of FIG. 21, L1 information generator 581 generates the transmission parameters to perform the conversion into the L1-pre information and L1-post information. FIG. 22 illustrates the L1 information included in the PLP loop in the L1-post (configurable). In each PLP, PLP_FEC_TYPE indicates that the code length of the LDPC coding is the 16 k mode. Each PLP includes PLP_COD indicating the coding rate, PLP_NON_UNI-FORM_CONST indicating whether the mapping is uniform or non-uniform, and PLP_MOD indicating the modulation method. The P1 symbol indicates that the frame format is NGH_MIMO. The L1 information about the L1-post included in the L1-pre is similar to that of the modification of the second exemplary embodiment in FIG. 14. In the case that the MIMO has the same LDPC code lengths as the SISO and the same coding rate as the SISO, the different non-uniform mapping patterns can be defined by including the L1 information, and posted to the receiver.

In L1 information processor 541 of FIG. 21, the operation of FEC coder 387 is similar to that of L1 information processor 345 of the modification of the second exemplary embodiment in FIG. 13. Mapper 583 performs the mapping in the I-Q coordinate to perform the conversion into the FEC block, and outputs the pieces of mapping data (cells).

The 64QAM (coding rate 7/15) constellation arrangement of the non-uniform mapping pattern in the L1-post is similar to that of the second exemplary embodiment in FIG. 11. As illustrated in FIG. 11, the non-uniform mapping for the data PLP (SISO) is not directly used in the L1-post (MIMO), but the non-uniform mapping of the two-rank-higher coding rate of 3/5 is used. The MIMO is the parallel transmission in which the plurality of transmission and reception antennas are used. In the MIMO, the required C/N ratio increases because it is difficult to completely remove the influence of interference between the antennas. In the L1-post, the non-uniform mapping of not a one-rank-higher coding rate of 8/15, but the two-rank-higher coding rate of 3/5 is used in consideration of the error correction capability degradation due to a small number of information bits.

In L1 information processor 541 of FIG. 21, MIMO coder 576 performs the MIMO coding on the pieces of mapping data (cells) output from mapper 583.

In transmission device 500 in FIG. 17, frame configuration part 521 generates and outputs the transmission frame of the DVB-NGH system in FIG. 24 using the mapping data of each PLP with respect to the two transmission antennas (Tx-1 and Tx-2) output from MIMO-PLP processor 531 and the mapping data of the L1 information about the two transmission antennas (Tx-1 and Tx-2) output from L1 information processor 541.

OFDM signal generator 2061 for each of the two transmission antennas performs the addition of the pilot signal, the IFFT, the insertion of the GI, and the insertion of the P1 symbol and the aP1 symbol on the transmission frame configuration of the DVB-NGH system output from frame configuration part 521, and outputs the digital baseband transmission signal. D/A converter 2091 for each of the two transmission antennas performs the D/A conversion on the digital baseband transmission signal output from OFDM signal generator 2061, and outputs the analog baseband transmission signal. Frequency converter 2096 for each of the two transmission antennas performs the frequency conversion on the analog baseband transmission signal output from D/A converter 2091, and outputs the analog RF transmission signal from a transmission antenna (not illustrated).

According to the above configuration, the transmission device, transmission method, and program for efficiently obtaining the shaping gain by defining the different non-uniform mapping patterns can be provided in the case that the MIMO has the same LDPC code length as the SISO and the same coding rate as the SISO in the transmission technology in which the modulation having the non-uniform mapping pattern is used.

<Reception Device and Reception Method>

Figure 23:
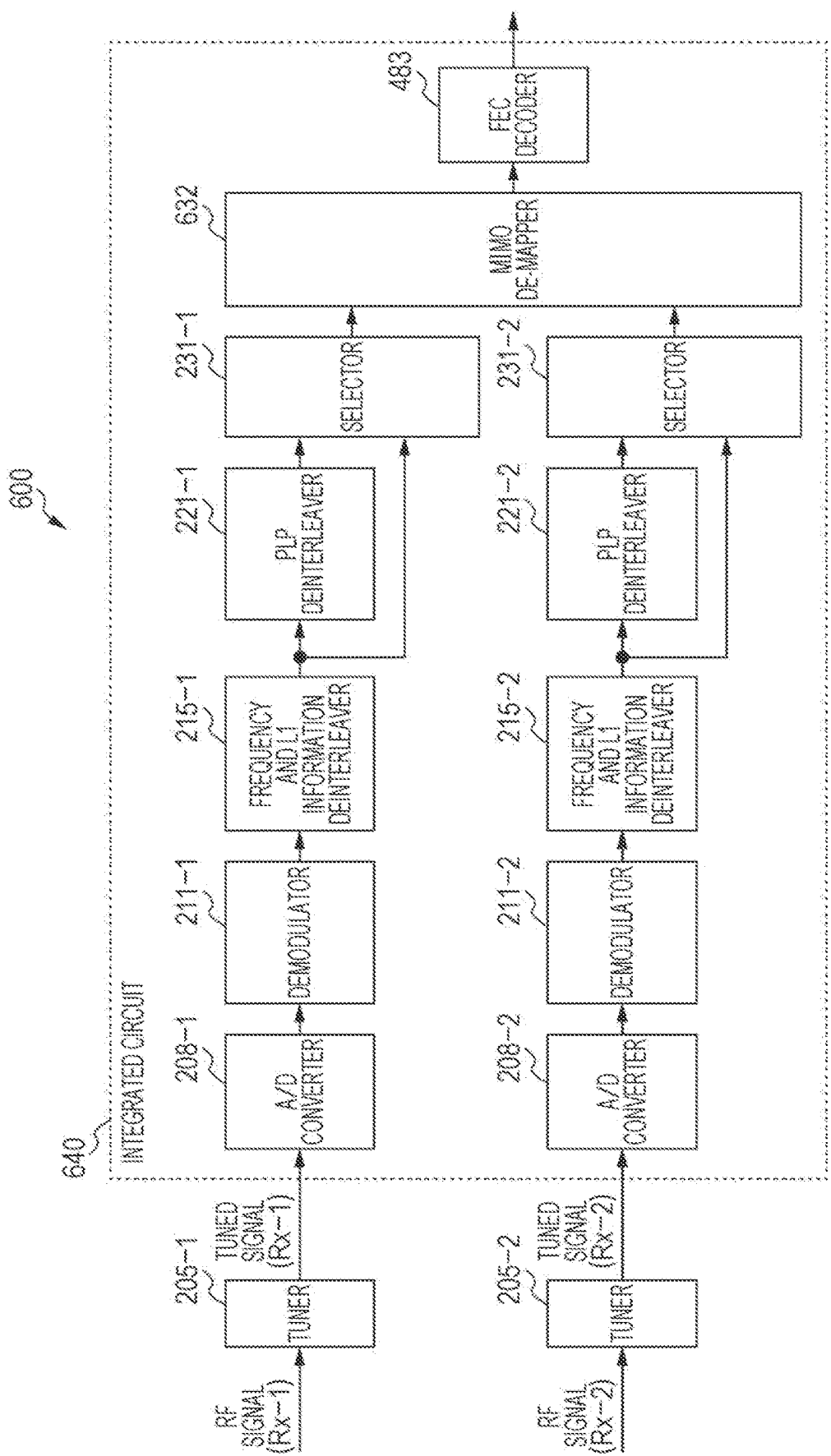
FIG. 23 is a view illustrating a configuration of reception device 600 of the third exemplary embodiment.

FIG. 23 is a view illustrating a configuration of reception device 600 in the third exemplary embodiment of the present disclosure. Reception device 600 in FIG. 23 corresponds to transmission device 500 in FIG. 17, and reflects the function of transmission device 500. The same component as transmission devices of the first and second exemplary embodiments is designated by the same reference mark, and the description is omitted.

Reception device 600 in FIG. 23 differs from reception device 450 of the modification of the second exemplary embodiment in FIG. 16 in the configuration in which de-mapper 482 is replaced with MIMO de-mapper 632. Reception device 200 includes tuner 205 A/D converter 208, demodulator 211, frequency and L1 information deinterleaver 215, PLP deinterleaver 221, and selector 231 for each of the reception antennas (Rx-1 and Rx-2).

The operation of reception device 600 will be described below. Tuner 205-1, A/D converter 208-1, demodulator 211-1, frequency and L1 information deinterleaver 215-1, PLP deinterleaver 221-1, and selector 231-1 perform the operations similar to those of reception device 450 of the modification of the second exemplary embodiment when the analog RF reception signal is input from reception antenna Rx-1. Tuner 205-2, A/D converter 208-2, demodulator 211-2, frequency and L1 information deinterleaver 215-2, PLP deinterleaver 221-2, and selector 231-2 perform the operations similar to those of reception device 450 of the modification of the second exemplary embodiment when the analog RF reception signal is input from reception antenna Rx-2.

MIMO de-mapper 632 performs the de-mapping processing on the L1-pre, and FEC decoder 483 performs the LDPC decoding processing and the BCH decoding processing. Therefore, the L1-pre information is decoded.

In performing the de-mapping processing on the L1-post, MIMO de-mapper 632 refers to L1_POST_FEC_TYPE, L1_POST_COD, L1_POST_NON_UNIFORM_CONST, and L1_POST_MOD in FIG. 14 from the decoded L1-pre information, and recognizes that frame format is NGH_MIMO from the received P1 symbol. Therefore, even if transmission device 500 in FIG. 17 defines the different non-uniform mapping patterns while the L1-Post (MIMO) have the same LDPC code lengths as the SISO and the same coding rate as the SISO, MIMO de-mapper 632 can detect the mapping pattern of the L1-post (MIMO), and perform the MIMO de-mapping processing based on the detected mapping pattern. FEC decoder 483 performs the LDPC decoding processing and the BCH decoding processing on the L1-post subjected to the MIMO de-mapping processing. Therefore, the L1-post information is decoded.

MIMO de-mapper 632 performs MIMO de-mapping processing on the cell data and channel estimated value of the PLP output from each of two selectors (231-1 and 231-2), and FEC decoder 483 performs the LDPC decoding processing and the BCH decoding processing. Therefore, the PLP data is decoded.

In performing the de-mapping processing, MIMO de-mapper 632 refers to PLP_FEC_TYPE, PLP_COD, PLP_NON_UNIFORM_CONST, and PLP_MOD in FIG. 22 with respect to PLP (for example, PLP-1 in FIG. 1) including the program selected by the user from the decoded L1-post information, and recognizes that frame format is NGH_MIMO from the received P1 symbol. Therefore, even if transmission device 500 in FIG. 17 defines the different non-uniform mapping patterns with respect to the different LDPC code lengths having the same coding rate while the L1-Post (MIMO) have the same LDPC code lengths as the data PLP (SISO) and the same coding rate as the data PLP (SISO), MIMO de-mapper 632 can detect the mapping patterns of the data PLP (MIMO), and perform the MIMO de-mapping processing based on the detected mapping patterns.

Integrated circuit 640 may be fabricated while including components except for tuner 205 in reception device 600 of FIG. 23.

According to the above configuration, the reception device, reception method, integrated circuit, and program for receiving the transmission signals in which the different non-uniform mapping patterns are defined can be provided in the case that the MIMO has the same LDPC code length as the SISO and the same coding rate as the SISO in the transmission technology in which the modulation having the non-uniform mapping pattern is used.

(Supplement)

The present disclosure is not limited to the exemplary embodiment, but the present disclosure can be implemented in any mode aimed at the achievement of the object of the present disclosure and the associated or attached object. For example, the present disclosure may be made as follows.

(1) The first to third exemplary embodiments may arbitrarily be combined.

(2) In the first to third exemplary embodiments, the DVB-NGH system is basically described. Alternatively, the present disclosure can be applied to another transmission system except for the DVB-NGH system.

(3) In the first to third exemplary embodiments, the two input streams and the two PLPs are described. However, the number of input streams and the number of PLPs are not limited to two.

(4) In the first to third exemplary embodiments, the non-uniform mapping pattern is used in the 64QAM modulation method. However, the present disclosure can be applied to another modulation method.

(5) In the first to third exemplary embodiments, the 64 k mode, the 16 k mode, and the 4 k mode are described as the code length of the LDPC coding by way of example. Alternatively, another code length can be used.

(6) In the first to third exemplary embodiments, the FEC coding system is the combination of the BCH coding and the LDPC coding. However, the FEC coding system is not limited to the combination of the BCH coding and the LDPC coding.

(7) In the third exemplary embodiment, the two transmission and reception antennas are described. Alternatively, at least three transmission and reception antennas may be used. The number of transmission and reception antennas may be varied.

(8) In the third exemplary embodiment, the MIMO profile in the DVB-NGH system are described. For an MISO (Multiple Input Single Output) frame of the base profile, the non-uniform mapping patterns may differ from each other in the case that the MISO and the SISO have the same coding rate and the same LDPC code length. In the case that the MISO and the MIMO have the same coding rate and the same LDPC code length, the non-uniform mapping patterns may differ from each other.

(9) In the first to third exemplary embodiments, in the case that the non-uniform mapping pattern is applied, the I coordinate and Q coordinate of the constellation arrangement have the same pattern. Alternatively, the I coordinate and the Q coordinate may have the patterns different from each other.

(10) In the first exemplary embodiment, the non-uniform mapping of the one-rank-lower coding rate in one of the different LDPC code lengths having the same coding rate is adapted to the coding rate of the other LDPC code length. Alternatively, the non-uniform mapping pattern may be varied with respect to the different LDPC code lengths having the same coding rate by another method.

(11) In the second exemplary embodiment, in the case that the L1 information has the same coding rate as the data PLP and the LDPC code length different from the data PLP, the non-uniform mapping of the two-rank-higher coding rate of the data PLP is adapted to the coding rate of the L1 information. Alternatively, the non-uniform mapping pattern may be varied with respect to the L1 information and the data PLP by another method.

(12) In the modification of the second exemplary embodiment, in the case that the L1 information has the same coding rate as the data PLP and the LDPC code length different from the data PLP, the non-uniform mapping of the one-rank-higher coding rate of the data PLP is adapted to the coding rate of the L1 information. Alternatively, the non-uniform mapping pattern may be varied with respect to the L1 information and the data PLP by another method.

(13) In the third exemplary embodiment, in the case that the data PLP (MIMO) and the data PLP (SISO) have the same coding rate and the same LDPC code length, the non-uniform mapping of the one-rank-higher coding rate of the data PLP (SISO) is adapted to the coding rate of the data PLP (MIMO). Alternatively, the non-uniform mapping pattern may be varied with respect to the data PLP (MIMO) and the data PLP (SISO) by another method.

(14) In the third exemplary embodiment, in the case that the L1 information (MIMO) and the L1 information (SISO) have the same coding rate and the same LDPC code length, the non-uniform mapping of the two-rank-higher coding rate of the L1 information (SISO) is adapted to the coding rate of the L1 information (MIMO). Alternatively, the non-uniform mapping pattern may be varied with respect to the L1 information (MIMO) and the L1 information (SISO) by another method.

(15) The first to third exemplary embodiments may be associated with the implementation using hardware and software. The first to third exemplary embodiments may be implemented or performed using a computing device (processor). For example, the computing device or processor may be a main processor/general-purpose processor, a digital signal processor (DSP), an ASIC (application specific integrated circuit), an FPGA (field programmable gate array), and other programmable logic devices. The first to third exemplary embodiments may be performed or implemented by connection of these devices.

(16) The exemplary embodiments may be performed by the processor or directly performed by the hardware, or implemented by a mechanism of a software module. The software module and the hardware implementation can also be combined. The software module may be stored in various computer-readable storage mediums such as a RAM, an EPROM, an EEPROM, a flash memory, a register, a hard disk, a CD-ROM, and a DVD.

The transmission device, transmission method, reception device, reception method, integrated circuit, and program of the present disclosure can particularly be used in the transmission system in which the modulation of the non-uniform mapping pattern is used.

What is claimed is:

1. A transmission device comprising:
a processor configured to:
perform forward error correction (FEC) coding on data to generate an FEC frame;
interleave bits included in the FEC frame to output a bit-interleaved FEC frame;
perform first mapping based on the bit-interleaved FEC frame to output first cells;
generate Layer-1 signaling information including a transmission parameter;
perform forward error correction (FEC) coding on the Layer-1 signaling information to output a Layer-1 FEC frame;
perform second mapping based on the Layer-1 FEC frame to output second cells; and
generate a transmission signal based on the first cells and the second cells; and
a transmitter configured to transmit the transmission signal,
wherein coding rates are provided for the FEC coding and the coding rates include a first coding rate and a second coding rate higher than the first coding rate,
non-uniform constellation maps are associated with the coding rates,
a first non-uniform constellation map is used when the first mapping is performed, the first non-uniform constellation map being associated with the first coding rate,
a second non-uniform constellation map is used when the second mapping is performed, the second non-uniform constellation map being associated with the second coding rate, and
the second coding rate is 3/5.

2. A reception device comprising:
a receiver configured to receive the transmission signal transmitted from the transmission device according to claim 1; and
a processor configured to:
demodulate the transmission signal; and
perform de-mapping with the first non-uniform constellation map and the second non-uniform constellation map.

* * * * *